United States Patent
Ye et al.

(10) Patent No.: US 7,221,524 B2
(45) Date of Patent: May 22, 2007

(54) LENS UNIT AND COMPACT IMAGE PICKUP MODULE

(75) Inventors: Zhijin Ye, Kanagawa (JP); Seiichi Watanabe, Kanagawa (JP); Kiyofumi Yamamoto, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 93 days.

(21) Appl. No.: 11/045,064

(22) Filed: Jan. 31, 2005

(65) Prior Publication Data

US 2005/0168846 A1   Aug. 4, 2005

(30) Foreign Application Priority Data

| Jan. 30, 2004 | (JP) | ............................. 2004-023663 |
| Feb. 10, 2004 | (JP) | ............................. 2004-033571 |
| Feb. 12, 2004 | (JP) | ............................. 2004-035020 |
| Feb. 27, 2004 | (JP) | ............................. 2004-053878 |

(51) Int. Cl.
   *G02B 7/02* (2006.01)
(52) U.S. Cl. ...................... 359/819; 359/811; 359/822; 359/823
(58) Field of Classification Search ................ 359/819, 359/821, 822, 823, 811, 694, 695, 699, 703
See application file for complete search history.

(56) References Cited

FOREIGN PATENT DOCUMENTS

| JP | 2002-82272 A | 3/2002 |
| JP | 2004-004566 | * 2/2003 |

* cited by examiner

*Primary Examiner*—Ricky Mack
*Assistant Examiner*—Brandi Thomas
(74) *Attorney, Agent, or Firm*—Sughrue Mion, PLLC

(57) ABSTRACT

The compact image pickup module includes an imaging lens, a lens-barrel holding the imaging lens, an image pickup element, an image pickup element holder holding the pickup element and into which the barrel is fitted so as to be rotatable about an optical axis of the imaging lens and movable in a direction of the optical axis, a cylindrical cam having as an upper or a lower surface thereof, an annular cam surface whose center is set at the optical axis and being formed in one of the barrel and the element holder and an abutment member being abutted against the cam surface under a state where the barrel is fitted into the element holder and formed in the other. After focusing is performed through relative rotation of the barrel and the element holder, the barrel and the element holder are fixed to each other. The lens unit includes the barrel and the imaging lens having multiple lenses held by the barrel.

22 Claims, 7 Drawing Sheets

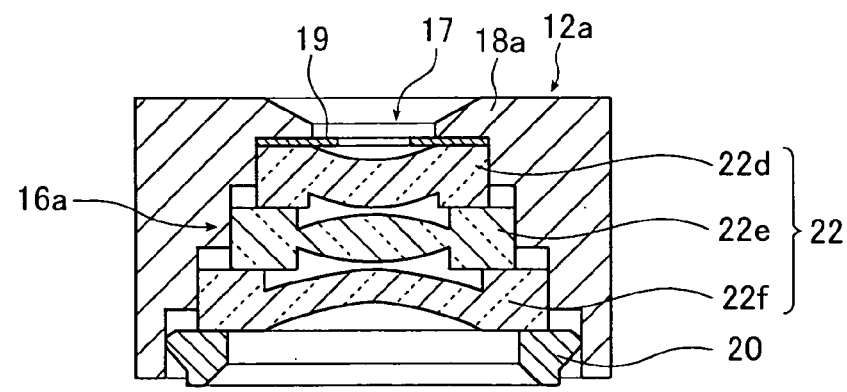
FIG.6A
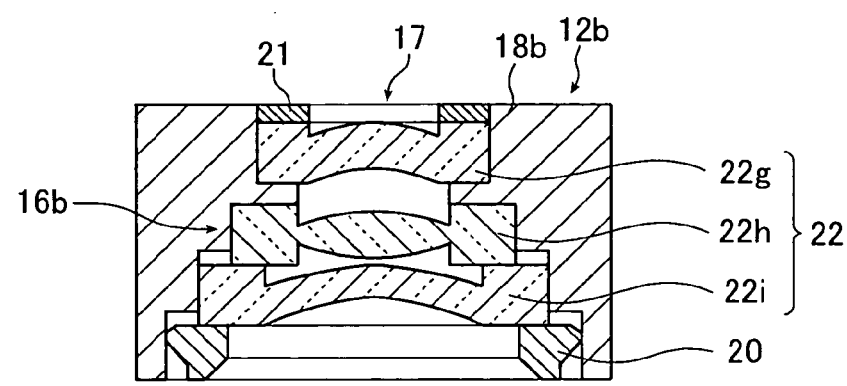
FIG.6B
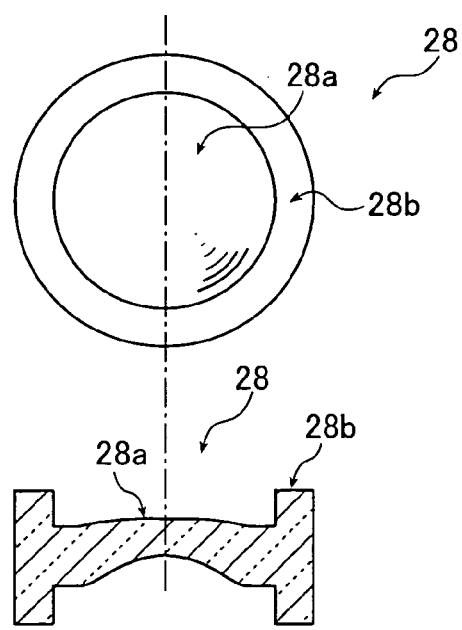
FIG.9A
FIG.9B

LENS UNIT AND COMPACT IMAGE PICKUP MODULE

This application claims priority on Japanese patent applications No. 2004-23663, No. 2004-33571, No. 2004-35020 and No. 2004-53878, the entire contents of which are hereby incorporated by reference.

BACKGROUND OF THE INVENTION

The present invention relates to a compact image pickup module that is attached to a mobile telephone or a PDA with a photographing function or the like, and a lens unit suitable for a compact image pickup module or the like, and more specifically to a compact image pickup module that is capable of performing appropriate focusing, preventing inclination of the optical axis of an imaging lens with respect to an image pickup element such as a CCD sensor, and performing alignment of the image pickup element such as a CCD sensor with ease, a compact image pickup module where macro photographing is realized with a simple mechanism, and a lens unit that includes multiple lenses and is capable of preventing displacements between the optical axes of the lenses.

A compact image pickup module installed in a mobile telephone, a PDA (Personal Digital Assistant), a compact digital camera, or the like is ordinarily constructed by combining an image pickup element (such as a CCD sensor or a CMOS sensor; hereinafter the CCD sensor will be described as a representative), a holding member (hereinafter referred to as "CCD holder") that holds the CCD sensor, an imaging lens (hereinafter also simply referred to as "lens"), and a cylindrical lens-barrel that holds the lens.

Such a compact image pickup module generally uses a CCD holder having a through hole and is assembled by fixing a CCD sensor to one end of the through hole, accommodating a lens-barrel holding an imaging lens from the other end of the through hole, and fixing the lens-barrel.

More specifically, as is well known, screw threads are cut into the inner wall surface of the CCD holder and the outer wall surface of the lens-barrel and are caused to mesh with each other. Then, focus adjustment (focusing) is performed by adjusting a distance between the light receiving surface of the CCD sensor and the imaging lens through adjustment of the screw-in amount of the lens-barrel. After the focus adjustment is performed, the CCD holder and the lens-barrel are fixed to each other using an adhesive or the like when the compact image pickup module is a fixed focus module.

Also, as a result of technological advancement in recent years, the image pickup element, such as the CCD sensor, has a highly reduced size and increased resolution. Therefore, the imaging lens (lens unit) applied to the compact image pickup module is also required to have resolving power with which it is possible to separate thin lines at a level of 150 to 200 [lp/mm] from each other. That is, an imaging lens having such high resolving power needs to be used as the imaging lens.

It is difficult to realize an imaging lens (lens unit) having such resolving power using a single lens. Therefore, an imaging lens (lens unit) having intended resolving power or precision is ordinarily realized using a combination lens obtained by combining multiple lenses with each other.

As schematically shown in FIG. 11, such an imaging lens (lens unit) produced by combining multiple lenses with each other ordinarily uses lenses 100 (100a, 100b, and 100c) having mutually different outer diameters and a lens-barrel 102 obtained by forming a lens holding portion, whose size is changed stepwise so as to correspond to the respective lens diameters, and is constructed by incorporating the lenses into the lens-barrel 102 in the order of the lens 100c, the lens 100b, and the lens 100a in accordance with the lens diameters and fixing the lenses 100 to the lens-barrel (see, for example, JP 2002-82272 A).

As a matter of course, in order to obtain a high-quality photography image, it is required that the imaging lens is fixed so that the optical axis of the imaging lens, that is, the lens-barrel is not inclined with respect to the light receiving surface of the CCD sensor.

When the optical axis is inclined, an imaging surface is also of course inclined, so a photographed image is not appropriately formed on the light receiving surface of the CCD sensor and image quality is degraded.

As described above, however, in the conventional compact image pickup module, the screw threads of the lens-barrel and the CCD holder are caused to mesh with each other, focus adjustment is performed by adjusting the screw-in amount, and then the lens-barrel and the CCD holder are fixed to each other. With this construction, gaps inevitably exist between the screw threads, so the lens-barrel is inclined and the optical axis of the imaging lens is inclined.

As described above, the CCD sensor has a highly reduced size and increased resolution due to the recent technological advancement and therefore an imaging lens having high resolving power, with which it is possible to separate thin lines at a level of 150 to 200 [lp/mm] from each other, is used as the imaging lens applied to the compact image pickup module. Therefore, when the optical axis is inclined, even if the degree of the inclination is small, there occurs extremely significant image quality degradation.

Also, in recent years, there are many cases where a compact image pickup module installed in a mobile telephone has a so-called macro photographing function that enables photographing in a close range or photographing of a small object by changing a photographing distance through movement of an imaging lens from an ordinary position toward the front (toward a subject).

In general, however, many components are used to realize the macro function (for instance, multiple springs are required) and the macro function also has a complicated structure, so a compact image pickup module where the macro photographing function is realized using a simpler construction is desired.

Further, in a like manner, as a matter of course, in order to obtain high-quality photography images with stability, it is required that positioning of the CCD sensor has been performed so that the optical axis of the imaging lens and the center of the light receiving portion (light receiving surface) of the CCD sensor appropriately coincide with each other.

In the compact image pickup module, for instance, the CCD sensor is incorporated into the CCD holder by performing rough positioning in a direction (hereinafter referred to as "x-y direction") orthogonal to the optical axis of the imaging leans through abutment of an end portion of the CCD sensor in the x-y direction against a reference portion provided for a sensor holding portion formed for the CCD holder.

Here, generally, accuracy in positional relation between the outer surface and the light receiving portion of the CCD sensor is in no way high. Consequently, when the positioning of the CCD sensor in the x-y direction is performed in the manner described above, it is impossible to perform the positioning of the CCD sensor in the x-y direction accurately so that the optical axis of the imaging lens and the center of the light receiving portion coincide with each other.

Therefore, in course of manufacture of the compact image pickup module, after the rough positioning in the x-y direction is performed using the outer surface in the manner described above, fine positioning in the x-y direction is performed so that the optical axis of the imaging lens and the center of the light receiving portion of the CCD sensor coincide with each other by taking a reference image and adjusting the positions of the lens-barrel and the CCD sensor while viewing an image obtained through the photographing. Following this, the CCD sensor is fixed to the CCD holder using an adhesive or the like.

Such CCD sensor incorporation work takes a very long time and is a factor of a reduction in productivity of the compact image pickup module and an increase in manufacturing cost thereof. In addition, with such positional adjustment in the x-y direction based on images obtained through photographing, there is also a case where stable manufacture of products of appropriate quality where the optical axes of imaging lenses and the centers of light receiving surfaces of CCD sensors coincide with each other becomes impossible depending on the skill of an operator, the precision of an adjustment jig, or the like.

Further, in a like manner, as a matter of course, in order to obtain a high-quality photography image, it is required that the optical axes of the lenses 100 incorporated into the lens-barrel 102 appropriately coincide with each other. In particular, in the compact image pickup unit, the imaging lens is required to have high resolving power as described above. Therefore, when displacements (hereinafter referred to as "inter-lens eccentricity") between the optical axes of the lenses 100 occur, even if the degrees of the displacements are small, there occurs extremely significant image quality degradation.

Between the lens-barrel 102 and the lenses 100, however, gaps (clearances) for incorporating the lenses 100 into the lens-barrel 102 exist, so the incorporated lenses 100 move in the lens-barrel 102 and the inter-lens eccentricity occurs.

SUMMARY OF THE INVENTION

A first object of the present invention is to solve the problems of the conventional techniques described above, and to provide a compact image pickup module applied to a mobile telephone with a photographing function, an inexpensive/compact digital camera, or the like, where a simple construction is used, appropriate focusing is performed, and it is possible to prevent optical axis inclination with reliability, and to provide a compact image pickup module where the number of components is reduced and a macro photographing function with a simple construction is realized.

Also, a second object of the present invention is to solve the problems of the conventional techniques described above, and to provide a compact image pickup module applied to a mobile telephone or a PDA with a photographing function, an inexpensive/compact digital camera, or the like, where a simple construction is used and it is possible to appropriately position a light receiving portion of an image pickup element, such as a CCD sensor, with respect to the optical axis of an imaging lens by performing positioning of the CCD sensor in an x-y direction (direction orthogonal to the optical axis of the imaging lens) through simple work.

Further, a third object of the present invention is to solve the problems of the conventional techniques described above, and to provide a lens unit suitably applied to a compact image pickup module or the like applied to a mobile telephone with a photographing function or the like and produced by incorporating multiple lenses into a lens-barrel, where a simple construction is used, the optical axes of the lenses are set so as to coincide with each other, and it is possible to prevent displacements between the optical axes of the lenses.

Still further, a fourth object of the present invention is to solve the problems of the conventional techniques described above, and to provide a lens unit suitably applied to a compact image pickup module or the like applied to a mobile telephone with a photographing function or the like and composed of multiple lenses, where it is possible to perform positioning of the lenses in a direction orthogonal to the optical axes of the lenses so that the optical axes of the lenses coincide with each other merely by combining the lenses with each other and displacements will never occur between the optical axes of the lenses after the lenses are combined with each other.

In order to attain the first object described above, a first aspect of the present invention provides a compact image pickup module comprising an imaging lens, a cylindrical lens-barrel that holds the imaging lens, an image pickup element, an image pickup element holder which holds the image pickup element and into which the lens-barrel is fitted so as to be rotatable about an optical axis of the imaging lens and movable in a direction of the optical axis of the imaging lens, a cylindrical cam which has as an upper surface or a lower surface thereof, an annular cam surface whose center is set at the optical axis of the imaging lens and which is formed in one of the lens-barrel and the image pickup element holder, and an abutment member which is abutted against the annular cam surface of the cylindrical cam under a state where the lens-barrel is fitted into the image pickup element holder and which is formed in the other of the lens-barrel and the image pickup element holder that does not have the cylindrical cam, wherein, after focusing is performed through relative rotation of the lens-barrel and the image pickup element holder, the lens-barrel and the image pickup element holder are fixed to each other.

It is preferable in the compact image pickup module according to the first aspect of the present invention that the image pickup element is obtained through dicing into each element after packaging with a sealing member on a silicon wafer is finished, the image pickup element holder has a lens-barrel holding portion that holds the lens-barrel and an element holding portion that holds the image pickup element, and positioning of the image pickup element in a direction orthogonal to the optical axis of the imaging lens is performed in the element holding portion of the image pickup element holder by setting a surface formed through dicing of the image pickup element as a reference surface and then the element holding portion of the image pickup element holder holds the image pickup element.

Also, it is preferable that the imaging lens includes multiple lenses, the lens-barrel has a lens holding region, and after at least one of heating of the lens-barrel and cooling of the multiple lenses is performed, the multiple lenses are incorporated into the lens holding region of the lens-barrel, and the multiple lenses are fixed to the lens-barrel when the lens-barrel and the multiple lenses have returned to ordinary temperature.

Further, it is preferable that the imaging lens includes multiple lenses combined with each other, each lens having a lens portion having optical action and a flange portion on the periphery of the lens portion, and the flange portion of one lens of the multiple lenses is capable of being fitted to the flange portion of at least one of other lenses, and each lens has a shape with which an optical axis of the one lens coincides with the optical axis of the at least one of the other lenses under a combined state where the one lens is combined with the at least one of the other lenses through fitting of flange portions to each other.

Also, in order to attain the first object described above, a second aspect of the present invention provides a compact image pickup module comprising an imaging lens, a cylindrical lens holder whose outer wall surface has a first convex portion formed thereon and which holds the imaging lens, an image pickup element, an image pickup element holder which holds the image pickup element, into which the cylindrical lens holder is inserted so as to be rotatable about an optical axis of the imaging lens and movable in a first direction of the optical axis of the imaging lens, and whose inner wall surface has a second convex portion formed thereon, a coil spring that engages with the first convex portion of the cylindrical lens holder and the second convex portion of the image pickup element holder and biases the lens holder and the image pickup element holder in a second direction in which a distance therebetween is increased, a first cylindrical cam that has as an upper surface or a lower surface thereof, an annular cam surface whose center is set at the optical axis of the imaging lens and which gradually increases in height in a circumferential direction, and that is formed in one of the cylindrical lens holder and the image pickup element holder, and a first abutment member that is abutted against the annular cam surface of the first cylindrical cam under a state where the cylindrical lens holder is inserted into the image pickup element holder and that is formed in the other of the cylindrical lens holder and the image pickup element holder that does no the t have the first cylindrical cam.

It is preferable in compact image pickup module according to the second aspect of the present invention that the cylindrical lens holder comprises a lens-barrel that holds the imaging lens in a fixed manner, and a photographing distance switching member into which the lens-barrel is fitted so as to be rotatable about the optical axis of the imaging lens and movable in the first direction of the optical axis direction of the imaging lens, wherein the compact image pickup module further comprises a second cylindrical cam that has as an upper surface or a lower surface thereof, an annular cam surface whose center is set at the optical axis of the imaging lens and that is formed in one of the lens-barrel and the photographing distance switching member, and a second abutment member that is abutted against the annular cam surface of the second cylindrical cam under a state where the lens-barrel is fitted into the image pickup element holder and that is formed for the other of the lens-barrel and the photographing distance switching member, and wherein, after focusing is performed by adjusting a distance between the imaging lens and the image pickup element in the first direction of the optical axis through relative rotation of the lens-barrel and the photographing distance switching member, the lens-barrel and the photographing distance switching member are fixed to each other.

Also, it is preferable that the image pickup element is obtained through dicing into each element after packaging with a sealing member on a silicon wafer is finished, the image pickup element holder has a lens holding portion that holds the cylindrical lens holder and an element holding portion that holds the image pickup element, and positioning of the image pickup element in a direction orthogonal to the optical axis of the imaging lens is performed in the element holding portion of the image pickup element holder by setting a surface formed through dicing of the image pickup element as a reference surface and then the element holding portion of the image pickup element holder holds the image pickup element.

Further, it is preferable that the imaging lens includes multiple lenses, the lens-barrel has a lens holding region, and after at least one of heating of the lens-barrel and cooling of the multiple lenses is performed, the multiple lenses are incorporated into the lens holding region of the lens-barrel, and the multiple lenses are fixed to the lens-barrel when the lens-barrel and the multiple lenses have returned to ordinary temperature.

Still further, it is preferable that the imaging lens includes multiple lenses combined with each other, each lens having a lens portion having optical action and a flange portion on the periphery of the lens portion, and the flange portion of one lens of the multiple lenses is capable of being fitted to the flange portion of at least one of other lenses, and each lens has a shape with which an optical axis of the one lens coincides with the optical axis of the at least one of the other lenses under a combined state where the one lens is combined with the at least one of the other lenses through fitting of flange portions to each other.

According to the first aspect of the present invention that has the construction described above, focus adjustment (focusing) is performed not by using a screw mechanism but by fitting the lens-barrel holding the imaging lens into the image pickup element holder holding the image pickup element, such as a CCD sensor, and moving the lens-barrel in the optical axis direction using the cylindrical cam, so it becomes possible to prevent inclination of the lens-barrel in the image pickup element holder and to appropriately perform the focus adjustment by the action of the cylindrical cam. As a result, according to this aspect, it becomes possible to realize a compact image pickup module where a simple construction is used, focus adjustment is appropriately performed, inclination of an optical axis is prevented, and a high-quality image can be taken.

Also, with the compact image pickup module according to the second aspect of the present invention, a macro photographing mechanism is realized by one coil spring, into which the lens holder is inserted, and the cylindrical cam, so it becomes possible to reduce the number of components and simplify the construction.

Also, in order to attain the second object described above, a third aspect of the present invention provides a compact image pickup module comprising an imaging lens, a lens-barrel that holds the imaging lens, an image pickup element that is obtained through dicing into each element after packaging with a sealing member on a silicon wafer is finished, and an image pickup element holder that has a lens-barrel holding portion that holds the lens-barrel and an element holding portion that holds the image pickup element, wherein positioning of the image pickup element in a direction orthogonal to an optical axis of the imaging lens is performed in the element holding portion of the image pickup element holder by setting a surface formed through dicing of the image pickup element as a reference surface and then the element holding portion of the image pickup element holder holds the image pickup element.

It is preferable that in the compact image pickup module according to the third aspect of the present invention, the positioning of the image pickup element in the direction orthogonal to the optical axis of the imaging lens is performed through fitting the surface formed through dicing of the image pickup element to the element holding portion of the image pickup element holder and then the element holding portion of the image pickup element holder holds the image pickup element.

Also, it is preferable that the element holding portion of the image pickup element has a site that is abutted against a photographing light incident surface of the image pickup element, and the positioning of the image pickup element in a direction of the optical axis of the imaging lens is performed through abutment of the site against the photographing light incident surface.

Further, it is preferable that the element holding portion of the image pickup element has a site that is abutted against a surface of a mounting substrate of the image pickup element, and the positioning of the image pickup element in a direction of the optical axis of the imaging lens is performed through abutment of the site against the surface of the mounting substrate of the image pickup element.

Still further, it is preferable that the element holding portion of the image pickup element has a site that is abutted against a surface of a wiring board of the image pickup element, and the positioning of the image pickup element in a direction of the optical axis of the imaging lens is performed through abutment of the site against the surface of the wiring board of the image pickup element.

Another, it is preferable that the imaging lens includes multiple lenses, the lens-barrel has a lens holding region, and after at least one of heating of the lens-barrel and cooling of the multiple lenses is performed, the multiple lenses are incorporated into the lens holding region of the lens-barrel, and the multiple lenses are fixed to the lens-barrel when the lens-barrel and the multiple lenses have returned to ordinary temperature.

Still another, it is preferable that the imaging lens includes multiple lenses combined with each other, each lens having a lens portion having optical action and a flange portion on the periphery of the lens portion, and the flange portion of one lens of the multiple lenses is capable of being fitted to the flange portion of at least one of other lenses, and each lens has a shape with which an optical axis of the one lens coincides with the optical axis of the at least one of the other lenses under a combined state where the one lens is combined with the at least one of the other lenses through fitting of flange portions to each other.

According to the third aspect of the present invention having the construction described above, it becomes possible to incorporate the image pickup element into the image pickup element holder by using the image pickup element obtained through the dicing into each element after packaging with the sealing member including cover glass, is finished, setting the side surfaces formed through dicing of the image pickup element (including side surfaces of the cover glass and side surfaces of partition walls that support the cover glass) as the reference surfaces, and performing the positioning of the image pickup element in the direction (x-y direction) orthogonal to the optical axis of the imaging lens using the reference surfaces. As a result, it becomes possible to appropriately perform the positioning of the image pickup element in the x-y direction with respect to the optical axis, accurately perform the positioning of the light receiving portion of the image pickup element with respect to the optical axis, and incorporate the image pickup element into the image pickup element holder merely by, for instance, fitting the side surfaces of the image pickup element to predetermined holding portions.

Consequently, according to the aspect of the present invention, it becomes possible to appropriately position the image pickup element, such as a CCD sensor, with respect to the optical axis and incorporate the image pickup element through simple work where the need for adjustment based on an image obtained through photographing or the like has been eliminated, so it becomes possible to improve the productivity of the compact image pickup module, reduce the manufacturing cost thereof, and yield products having appropriate quality with stability.

Also, in order to attain the third object described above, a fourth aspect of the present invention provides a lens unit comprising a tubular lens-barrel having a lens holding region, and multiple lenses held by the lens-barrel, wherein, after at least one of heating of the tubular lens-barrel and cooling of the multiple lenses is performed, the multiple lenses are incorporated into the lens holding region of the tubular lens-barrel, and the multiple lenses are fixed to the tubular lens-barrel when the tubular lens-barrel and the multiple lenses have returned to ordinary temperature.

It is preferable in the lens unit according to the fourth aspect of the present invention that each of the multiple lenses has a lens portion having optical action and a flange portion on the periphery of the lens portion, the multiple lenses are stacked on each other in the tubular lens-barrel by bringing flange portions of the multiple lenses into intimate contact with each other, and positional relations between the multiple lenses in an optical axis direction become appropriate under a stacked state of the multiple lenses.

According to the fourth aspect of the present invention having the construction described above, in the lens unit produced by incorporating the multiple lenses into the lens-barrel, the inner diameter of the lens holding portion of the lens-barrel and the outer diameters of the lenses are set equal to each other, the lenses are incorporated into the lens-barrel by at least one of heating the lens-barrel and cooling the lenses, and the lenses are fixed to the lens-barrel under the state where at least one of the lens-barrel and the lenses have returned to the ordinary temperature because the diameter of the lens-barrel and the diameters of the lenses are set equal to each other. Therefore, it becomes possible to set the optical axes of the lenses so as to coincide with each other merely by incorporating the lenses into the lens-barrel. In addition, the lenses will never move, so displacements between the optical axes of the lenses will never occur. As a result, according to this aspect, it becomes possible to produce a highly precise lens unit, in which the optical axes of all lenses coincide with each other, with high productivity and to suitably use the lens unit as, for instance, a lens unit of a compact image pickup module applied to a mobile telephone with a photographing function.

Also, in order to attain the fourth object described above, a fifth aspect of the present invention provides a lens unit comprising multiple lenses combined with each other, each lens having a lens portion having optical action and a flange portion on the periphery of the lens portion, wherein the flange portion of one lens of the multiple lenses is capable of being fitted to the flange portion of at least one of other lenses, and each lens has a shape with which an optical axis of the one lens coincides with the optical axis of the at least one of the other lenses under a combined state where the one lens is combined with the at least one of the other lenses through fitting of flange portions to each other.

It is preferable in the lens unit according to the fifth aspect of the present invention that each lens of the multiple lenses has a shape with which a position of each lens in a direction of the optical axis becomes appropriate under the combined state where the one lens is combined with the at least one of the other lenses through fitting of flange portions to each other.

Also, it is preferable that each lens of the multiple lenses is a lens formed through injection molding and no mold seam exist on at least one of contact surfaces of lenses being contact with each other in a direction of the optical axis under the combined state and contact surfaces of lenses being contact with each other in a direction orthogonal to the optical axis under the combined state.

With the lens unit according to the fifth aspect of the present invention that has the construction described above, in the lens unit including the multiple lenses, it becomes possible to obtain an imaging lens or the like where merely by combining the multiple lenses with each other through fitting of the flange portions of the lenses to each other, positioning in the direction orthogonal to the optical axis is performed so that the optical axes of the lenses coincide with each other and, more preferably, positioning in the optical axis direction is also performed. Also, according to this aspect, it becomes possible to deal with the multiple lenses in the same manner as one lens after the lenses are combined with each other, so it also becomes possible to prevent displacements between optical axes of the lenses after the lenses are combined with each other.

BRIEF DESCRIPTION OF THE DRAWINGS

In the accompanying drawings:

FIGS. 6A and 6B are schematic cross-sectional views each showing the lens unit according to another embodiment of the present invention;

FIGS. 9A and 9B are respectively a schematic plan view and cross-sectional view of lenses constituting the lens unit shown in FIG. 7;

DETAILED DESCRIPTION OF THE PREFERRED EMBODIMENTS

Hereinafter, a compact image pickup module and a lens unit according to the present invention will be described in detail based on preferred embodiments illustrated in the accompanying drawings.

First, a compact image pickup module according to the first and third aspects of the present invention and a lens unit according to the fourth aspect of the present invention will be described with reference to FIGS. 1 to 6B.

Figure 1:
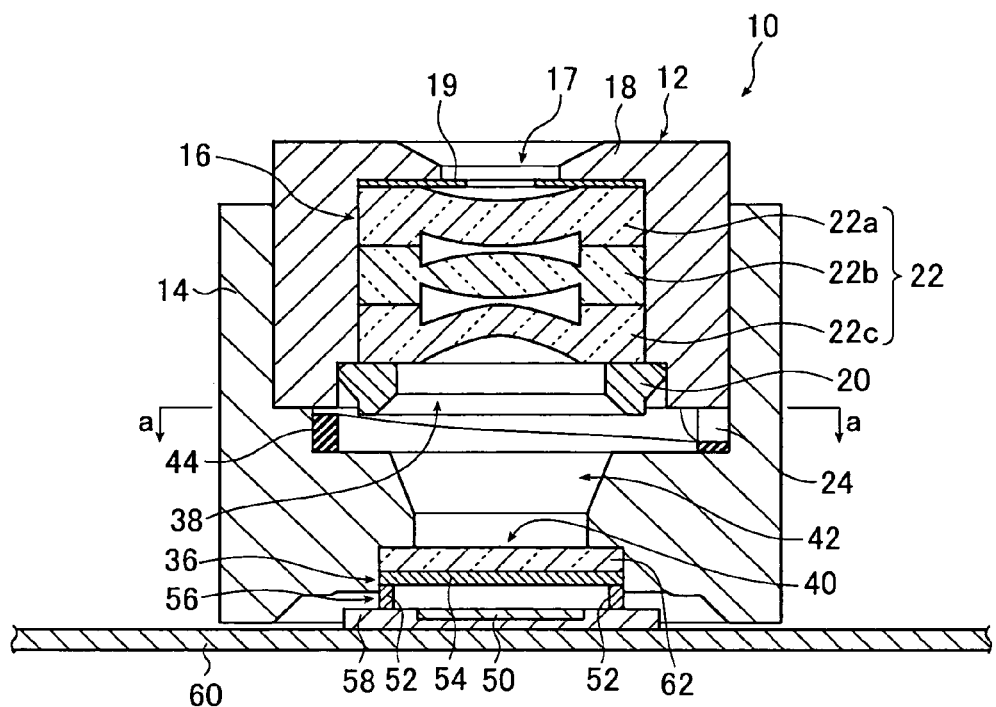
FIG. 1 is a schematic cross-sectional view of a compact image pickup module according to an embodiment of the present invention.

FIG. 1 is a schematic cross-sectional view of an embodiment of the compact image pickup module according to the first and third aspects of the present invention. Note that FIG. 1 is a cross-sectional view taken by cutting the compact image pickup module along a plane containing the optical axis of an imaging lens (hereinafter simply referred to as "optical axis"). Here, the compact image pickup module shown in FIG. 1 uses the lens unit according to the fourth aspect of the present invention, although the present invention is not limited to this and the compact image pickup module may use another lens unit.

The compact image pickup module (hereinafter referred to as "image pickup module") 10 shown in FIG. 1 is applied to a mobile telephone or a PDA having a photographing function, an inexpensive, compact, and fixed focus digital camera, or the like and basically includes an optical unit (hereinafter referred to as "lens unit") 12 and a CCD holder 14.

The lens unit 12 is obtained by incorporating an imaging lens 16 composed of three lenses 22 (22a, 22b, and 22c) at a predetermined position in a lens-barrel 18 and then fixing the imaging lens 16 using a ring-shaped lens retainer 20. Note that the lens retainer 20 is fixed to the lens-barrel 18 using an adhesive or the like.

Here, the lens-barrel 18 is a cylindrical member whose one end is closed, with a through hole 17 for incidence of photographing light being formed on the closed surface and a diaphragm 19 being arranged between the through hole 17 and the imaging lens 16. Also, for an end portion of the lens-barrel 18 on a CCD sensor 36 side in an optical axis direction (hereinafter the CCD sensor 36 side will be referred to as "lower side" and the opposite side (photographing light incident side) will be referred to as "upper side" for ease of explanation), a leg portion 24 that is abutted against a cam surface (upper surface) of a cylindrical cam 44 of the CCD holder 14 to be described later is formed so as to protrude in a downward direction. It is sufficient that the shape and size of the leg portion 24 are determined as appropriate so that when the lens unit 12 (lens-barrel 18) is appropriately fitted into the CCD holder 14, the leg portion 24 is appropriately abutted against the cylindrical cam 44 to be described later.

It should be noted here that the lens retainer 20 and the diaphragm 19 may be omitted when they are unnecessary. Also, the insertion position of the diaphragm 19 is not limited to the upper portion of the lens unit 12, that is, above the lens 22a.

It should be noted here that in the illustrated example, the imaging lens 16 is constructed using a combination lens composed of the three lenses 22 (lens 22a, lens 22b, and lens 22c), although the present invention is not limited to this and there occurs no problem even when the number of the lenses 22 is changed to two or less or four or more.

Figure 2A:
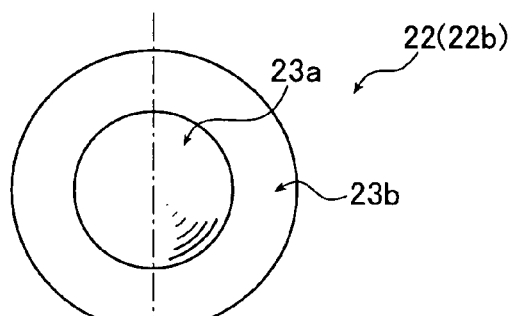
FIGS. 2A and 2B are respectively a schematic plan view and cross-sectional view of lenses constituting the lens unit according to the present invention applied to the compact image pickup module shown in FIG. 1.
Figure 2B:
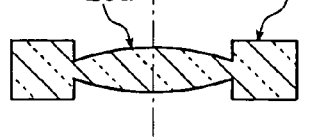

As a preferable form, the image pickup module 10 in the illustrated example includes the lens unit 12 composed of the three lenses 22 (lens 22a, lens 22b, and lens 22c) described below. In the lens unit 12 of the image pickup module 10, as schematically shown in FIGS. 2A and 2B using the lens 22b as a representative, the lenses 22 are each a circular-shaped (shape viewed from the optical axis direction) lens having a flange part (flange portion 23b) on the periphery of a lens part (lens portion 23a) having an optical action and the outer diameters of the lenses 22, that is, the flange portions 23b of the lenses 22 are set equal to each other. Accordingly, as shown in FIG. 1, by stacking the lenses 22 on each other in the optical axis direction, a columnar (straight pipe)-shaped member is obtained. Also, the lenses 22 have been molded so that the optical axes thereof coincide with each other and the intervals therebetween in the optical axis direction become appropriate when the lenses 22 are stacked on each other so that the rims of the flange portions 23b coincide with each other and the flange portions 23b are in intimate contact with each other. Consequently, the lenses 22 each have a shape with which the optical axes coincide with each other and the intervals in the optical axis direction become appropriate.

Also, the lens-barrel 18 has a columnar region (region having a straight pipe shape), whose inner diameter is set equal to the outer diameters of the flange portions of the lenses 22, and the three lenses are incorporated into this region under a state where the flange portions are stacked on each other.

With such a construction where straight pipes are combined with each other, that is, straight pipes whose diameters are equal to each other are combined with each other, it becomes possible to more suitably suppress displacements (hereinafter referred to as "inter-lens eccentricity") between the optical axes of the lenses 22 ascribable to play for incorporation of the lenses into the lens-barrel in the compact image pickup module that uses a combination lens. Therefore, the construction described above is preferable.

Here, as a matter of course, in order to take a high-quality image using the combination lens, it is required that the optical axes of the lenses 22 are appropriately positioned. In an ordinary lens unit, however, as described above, there exists play for incorporation of lenses into the lens-barrel, so displacements of the optical axes of the lenses occur at the time of the incorporation and it is difficult to obtain a situation where the optical axes coincide with each other.

Figure 11:
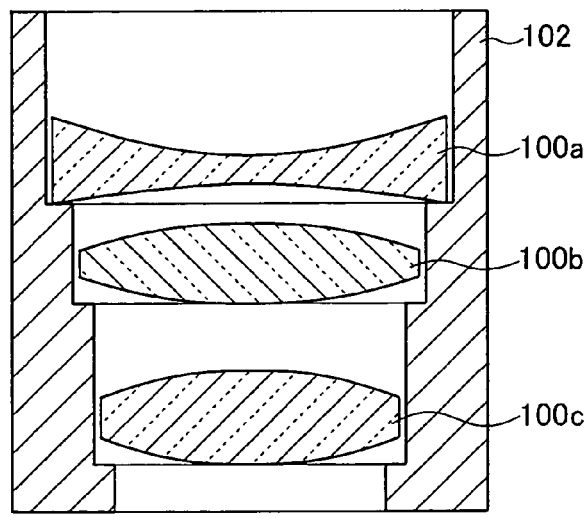
FIG. 11 is a schematic cross-sectional view of a conventional lens unit.

Also, ordinarily, in the compact image pickup module applied to a mobile telephone or the like, a high resolution is required, so glass lenses are used. Through molding of glass, it is impossible to obtain a lens having a complicated shape. Therefore, in the conventional compact image pickup module, as disclosed in JP 2002-82272 A (patent document 1) or the like, that is, as shown in FIG. 11, multiple circular-shaped lenses having different diameters are combined with each other and are incorporated into a step-shaped lens-barrel having a lens accommodation portion whose diameter is changed in a step manner. When a dimensional error or the like has occurred to such a lens-barrel, a mold for producing the lens-barrel is re-shaped. Ordinarily, however, one mold is created for each diameter of the accommodation portion, so when the center of the reshaped mold becomes different from those of other molds, there occurs the inter-lens eccentricity.

Here, in recent years, a plastic molding technique has been dramatically improved and it has become possible to produce a lens having the resolving power described above through highly precise molding even when the lens has a complicated shape that is impossible to obtain through molding of glass.

The lens unit 12 in the illustrated example uses lenses made with the plastic molding technique. That is, as described above, the lens unit 12 uses the multiple lenses 22 having thicknesses corresponding to the positions thereof in the optical axis direction and flange portions whose outer diameters are equal to each other, that is, the lenses 22 that each have a circular shape with which the flange portions 23b having the same outer-diameter are provided on the peripheries of the lens portions 23a and the optical axes coincide with each other when the lenses are disposed in the optical axis direction so that the rims of the flange portions 23b coincide with each other, with the lenses 22 being accommodated into the lens-barrel 18 having a straight pipe shape with the same diameter so that the flange portions are stacked on each other. With this construction, the inter-lens eccentricity due to the play for the incorporation is eliminated. Also, merely by incorporating the lenses 22 into the lens-barrel 18, it is possible to achieve a coincidence of the optical axes where no inter-lens eccentricity of the lenses 22 exists and also perform positioning of the lenses 22 in the optical axis direction. In addition, the lens holding region of the lens-barrel 18 has a straight pipe shape, so even when the mold for the lens-barrel 18 is reshaped, this results in a situation where the mold is reshaped with respect to every lens, so it also becomes possible to eliminate the inter-lens eccentricity ascribable to deviations between molds.

Here, as described above, in the lens unit 12, the outer diameters of the lenses 22 and the inner diameter of the lens-barrel 18 are set equal to each other. Therefore, it is difficult to incorporate the lenses 22 into the lens-barrel 18 with an ordinary method. In particular, it is extremely difficult to incorporate each lens 22 into the lens-barrel 18 under an appropriate state.

In order to prevent such inconvenience, for instance, it is possible to suitably use a method with which after the lens-barrel 18 is heated and is increased in diameter through linear expansion, each lens 22 is incorporated at an appropriate position of the lens-barrel 18 like in the case of the lens unit according to the fourth aspect of the present invention. Alternatively, a method is also suitable with which each lens 22 is cooled for shrinkage and is incorporated into the lens-barrel. Still alternatively, the heating of the lens-barrel 18 and the cooling of each lens 22 may be used in combination. With these methods, it becomes possible to incorporate each lens 22 at an appropriate position of the lens-barrel 18 without much effort. Note that the details of the lens unit according to the fourth aspect of the present invention will be described later.

It should be noted here that the assembling methods described above can also be effectively used at the time of incorporation (see FIG. 11) of the multiple lenses having different diameters into the lens-barrel having a step-shaped accommodation portion as disclosed in JP 2002-82272 A described above.

The compact image pickup module according to this aspect is not limited to the one shown in FIG. 1 where the lenses 22 including the flange portions having the same diameter are stacked on each other to form the imaging lens 16. For instance, like in the case of the ordinary compact image pickup module (see FIG. 11) disclosed in JP 2002-82272 A described above, the imaging lens may be constructed by combining multiple lenses having different diameters with each other and may be incorporated into a lens-barrel having a lens holding portion whose diameter is changed in a step manner.

Also, as other preferable imaging lenses used in the present invention, it is possible to cite imaging lenses respectively conceptually shown in FIGS. 6A and 6B, and FIG. 8 to be described later as examples.

Figure 8:
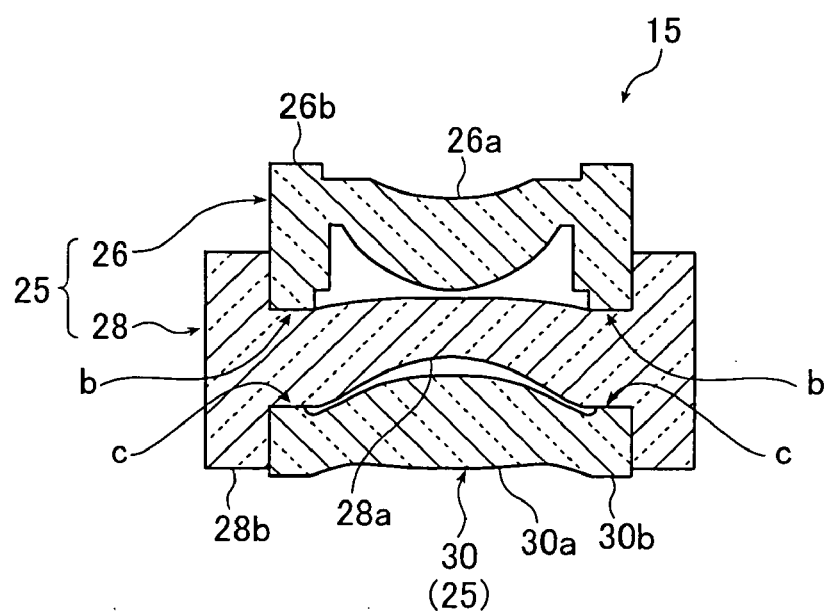
FIG. 8 is a schematic cross-sectional view of an embodiment of a lens unit shown in FIG. 7.

For instance, an imaging lens 15 shown in FIG. 8 is a combination lens obtained by combining circular-shaped three lenses 25 (26, 28, and 30) having flange portions on the peripheries of the lenses with each other like in the case of the example described above, although the imaging lens 15 is assembled not by stacking the lenses 25 on each other but by fitting the flange portions to each other.

The details of the imaging lens 15 will be described later, so the brief description thereof will be given below. A flange portion 26b of the lens 26 is fitted to an inside surface on one side of a flange portion 28b of the lens 28, a flange portion 30b of the lens 30 is fitted to an inside surface on the other side of the flange portion 28b of the lens 28, and surfaces (surfaces viewed from the optical axis direction) of the flanges 26b and 30b of the lenses 26 and 30 are abutted against the lens 28, thereby obtaining a combination lens composed of the three lenses 26, 28, and 30.

Here, each of the lenses 26, 28, and 30 has a shape with which its optical axis coincides with those of other lenses by appropriately assembling the imaging lens 15 through fitting of the flange portions 26b, 28b, and 30b to each other. More preferably, each of the lenses 26, 28, and 30 has a shape with which the positions of the lenses in the optical axis direction also become appropriate under an appropriately assembled state.

That is, by assembling the imaging lens 15 through fitting of the flange portions to each other, it is possible to automatically achieve the coincidence of the optical axes with no inter-lens eccentricity and also perform positioning of the lenses in the optical axis direction. Accordingly, with the imaging lens 15, it becomes possible to prevent the inter-lens eccentricity and also perform positioning in the optical axis direction without depending on the lens-barrel. Also, even when the lens-barrel has a straight pipe shape like for the lens-barrel 18, it is possible to incorporate the lenses into the lens-barrel with ease.

As to the lenses 22 (22a, 22b, 22c, 22d, 22e, 22f, 22g, 22h, and 22i) shown in FIG. 1, FIG. 2, and FIGS. 6A and 6B and the lenses 25 (26, 28, and 30) shown in FIG. 8 used in the compact image pickup module according to the present invention, it is preferable that no mold seam (mold parting line) exist on reference surfaces for positioning of the lenses. In other words, it is preferable that molding of the lenses be performed using molds produced by creating seam surfaces at positions outside the reference surfaces so that no parting line exists on the reference surfaces.

In particular, it is preferable that no parting line exist on surfaces (reference surfaces) for positioning in the optical axis direction such as each flange surface in the case of the lenses 22 and each abutment surface of the flange portions and the lens portions indicated with arrows b and arrows c in FIG. 8 in the case of the lenses 25. That is, in the case of the lenses 22 and the lenses 25, it is preferable that molding of the lenses be performed so that a parting line exists at a position outside the surfaces (reference surfaces) for positioning in the optical axis direction such as the flange surfaces and the abutment surfaces.

As described above, in the case of the imaging lenses 16, 16a, and 16b shown in FIG. 1 and FIGS. 6A and 6B and the imaging lens 15 shown in FIG. 8, by combining the lenses with each other through abutment of the flange portions or the lens portions against each other, the optical axes are set so as to coincide with each other and the positioning in the optical axis direction is performed. Accordingly, when a parting line exists on the reference surfaces, there is a possibility that errors will occur to the positions of the lenses or the positional relations between the lenses in the lens-barrel and positional displacements in the optical axis direction or the inter-lens eccentricity will occur.

That is, by eliminating the parting line from the reference surfaces, it becomes possible to produce an imaging lens that is a combination lens with a higher degree of precision by suitably preventing the inter-lens eccentricity and positional displacements of the lenses in the optical axis direction ascribable to the parting line.

Next, the characteristic portions of the image pickup module according to the first aspect of the present invention will be described.

The CCD holder 14 is a tubular member (in the illustrated example, the upper portion has a cylindrical shape and the lower portion has a square tubular shape) that holds the lens unit 12 (that is, the lens-barrel 18) described above and the CCD sensor 36, with a unit holding portion 38 that holds the lens unit 12 being formed in the upper portion, a sensor holding portion 40 that holds the CCD sensor 36 being formed in the lower portion, and a photographing light passage hole 42 being formed through which the holding portions communicate with each other.

The unit holding portion 38 is a columnar-shaped hole portion into which the lens-barrel 18 is fitted so as to be rotatable about the optical axis and movable in the optical axis direction and which has an inner diameter that is approximately equal to the outer diameter of the lens-barrel 18.

Figure 3A:
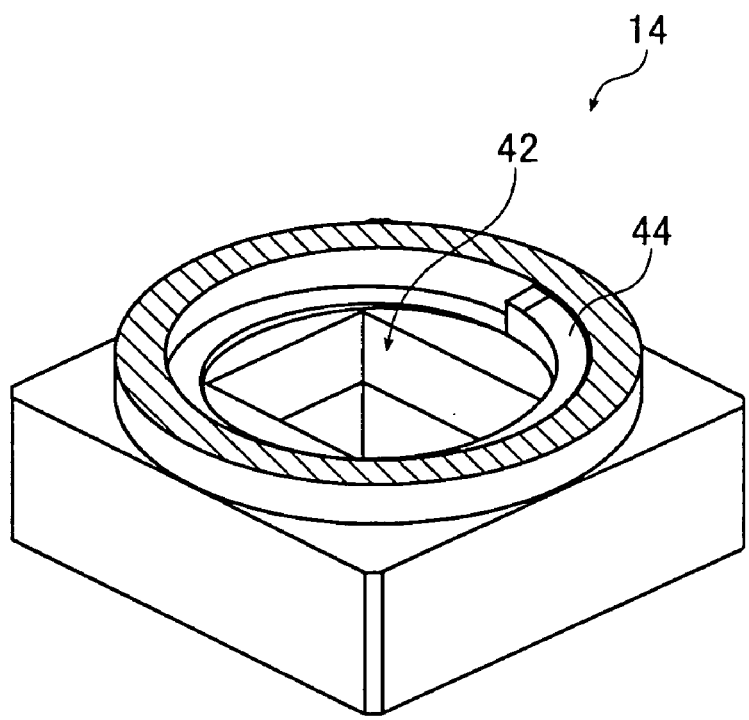
FIGS. 3A and 3B are partial cross-sectional perspective views each showing the compact image pickup module shown in FIG. 1.

Also, in the lower portion of the unit holding portion 38, a cylindrical cam 44 for focus adjustment (for focusing) is formed. As shown in FIG. 3A that is a schematic perspective view taken by cutting the image pickup module 10 along a-a line in FIG. 1, the cylindrical cam 44 is an annular cylindrical cam whose upper surface is set as a cam surface having a center axis at the optical axis and which gradually increases in height (whose cam surface is elevated) in a circumferential direction (rotation direction of the lens-barrel 18). In the illustrated example, the cylindrical cam 44 gradually increases in height in a counterclockwise direction.

With the construction described above where the lens-barrel 18 and the unit holding portion 38 are each formed in a straight pipe shape having no screw thread or the like and the lens-barrel 18 is fitted into the CCD holder 14, so a situation in which the lens-barrel 18 is inclined in the CCD holder 14 (unit holding portion 38) is prevented. As a result, it becomes possible to prevent inclination of the imaging lens 16 with respect to the light receiving surface of the CCD sensor 36.

Also, as described above, in the lower end portion of the lens-barrel 18, the leg portion 24 is provided which is abutted against the cylindrical cam 44 when the lens-barrel 18 is fitted into the CCD holder 14. Accordingly, after being fitted into the CCD holder 14, the lens-barrel 18 is rotated while being pressed in the downward direction, thereby changing the height of the cam surface against which the leg portion 24 is abutted. Through the changing of the height, the leg portion 24, that is, the lens-barrel 18 is moved vertically by the cylindrical cam 44 (in the illustrated example, the lens-barrel 18 moves in the upward direction through rotation in the counterclockwise direction and moves in the downward direction through rotation in the clockwise direction). Through the vertical movement of the lens-barrel 18, it is possible to adjust the distance between the light receiving surface of the CCD sensor 36 and the imaging lens 16 and perform focus adjustment (focusing).

In the conventional compact image pickup module, as described above, the focus adjustment is performed by the action of the screw threads, so there occurs a situation where the lens-barrel is inclined due to gaps between the screw threads, the optical axis of the imaging lens is inclined, and it is impossible to take a high-quality image.

In contrast to this, in this aspect, the lens-barrel 18 and the CCD holder 14 (unit holding portion 38) are each formed in a straight pipe shape, the lens-barrel 18 is fitted into the CCD holder 14 so as to be rotatable and movable in the optical axis direction, and focusing is performed by the action of the cylindrical cam. As a result, an image pickup module 10 is realized in which a simple construction is used, focus adjustment is appropriately performed, inclination of the optical axis is prevented, and it is possible to take a high-quality image. In addition, in this embodiment where the lens-barrel is supported by a straight-pipe-shaped surface, it becomes possible to obtain a large region for supporting the lens-barrel in the vertical direction as compared with the case where the screw threads are used. Therefore, it also becomes possible to hold the lens-barrel with stability, meaning that the construction in this embodiment is advantageous to prevention of inclination of the optical axis.

In the image pickup module 10 in this embodiment, the gap between the outer surface of the lens-barrel 18 and the inside wall of the unit holding portion 38 of the CCD holder 14 (clearance therebetween) is not specifically limited and it is sufficient that the gap is determined so that it is possible to fit the lens-barrel 18 into the CCD holder 14 so as to be rotatable and movable in the optical axis direction.

It should be noted here that in order to suitably prevent the inclination of the lens-barrel 18, the gap therebetween is preferably set at 1 to 20 μm, more preferably 1 to 10 μm, particularly preferably 1 to 5 μm.

Also, a smaller gap is more preferable, although the appropriate size of the gap is determined in accordance with roundness, cylindricity, and the surface roughness of fit surfaces. When consideration is given to the gap described above, the roundness of the outer surface of the lens-barrel and the inner wall surface of the unit holding portion 38 of the CCD holder 14 is preferably set at 20 μm or less, more preferably 10 μm or less, particularly preferably 1 μm or less. Also, the cylindricity of the outer surface of the lens-barrel and the inner wall surface of the unit holding portion 38 of the CCD holder 14 is preferably set at 20 μm or less, more preferably 10 μm or less, particularly preferably 1 μm or less. Further, the surface roughness of the fit surfaces of the lens-barrel 18 and the unit holding portion 38 is preferably set at 10 μm or less, more preferably 2 μm or less, particularly preferably 0.2 μm or less on the basis of arithmetic average roughness Ra.

By satisfying at least one of the ranges described above, preferably, by satisfying all of them, it becomes possible to suitably prevent inclination of the optical axis and favorably ensure workability of the focus adjustment and the like while ensuring industrially stable productivity.

Figure 3B:
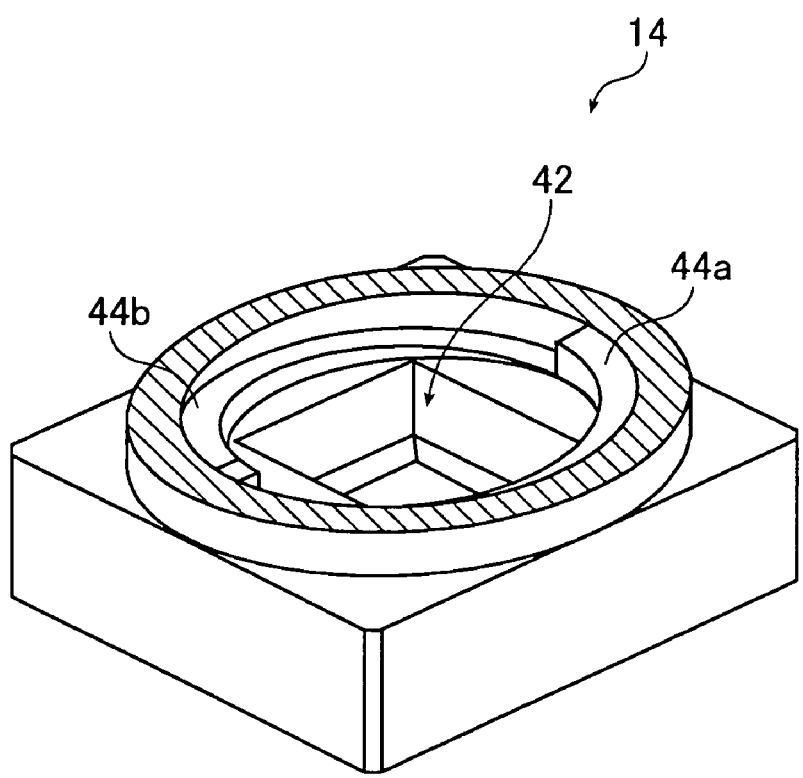

In the illustrated example, only one cylindrical cam 44 making one round is used, although the present invention is not limited to this. For instance, as shown in FIG. 3B, two cylindrical cams 44a and 44b that are each in an annular shape making a half round may be used instead. Alternatively, three cylindrical cams that each make ⅓ round or four cylindrical cams that each make ¼ round may be provided instead.

It should be noted here that in the illustrated example, one cylindrical cam 44 in an annular shape making one round is provided, although the present invention is not limited to this and one cylindrical cam in an annular shape making less than one round such as a half round or ⅔ round may be provided. In addition, when multiple cylindrical cams are provided, the cylindrical cams may have annular shapes that do not make an entire round, that is, make an intermittent round.

The leg portions 24 may be provided whose number is equal to the number of the cylindrical cams or is less than the number of the cylindrical cams. In the present invention, a construction is used in which the lens-barrel 18 is fitted into the CCD holder 14, so even when the number of the leg portions 24 abutted against the cylindrical cam 44 is one, a situation will never occur in which the lens-barrel is inclined in the CCD holder 14, which prevents a situation where the optical axis is inclined.

Also, the lens-barrel 18 may have multiple leg portions 24 whose number is larger than the number of the cylindrical cams. More specifically, for instance, for one cylindrical cam, two leg portions 24 having different lengths corresponding to a difference of elevation for a half round of the cylindrical cam may be provided on the diameter of the cylindrical cam.

Further, multiple cylindrical cams having mutually different heights or inclination angles (profiles) of cam surfaces or a cylindrical cam having regions whose change amounts of the cam surface with respect to a rotation amount are different from each other, may be formed for one leg portion, thereby making it possible to make a selection from among a case where the adjustment width of the focus adjustment (movement amount of the lens-barrel in the optical axis direction) is increased and a case where finer focus adjustment is performed. Alternatively, multiple leg portions having different heights may be provided for one cylindrical cam making a half round, thereby making it possible to make a selection of the position of the imaging lens in the vertical direction at multiple stages.

This aspect is not limited to the construction in the illustrated example where the cylindrical cam 44 is formed for the CCD holder 14 and the leg portion 24 abutted against the cylindrical cam 44 is formed for the lens-barrel 18. For instance, a cylindrical cam may be formed for the lens-barrel or the lower surface of the lens-barrel may be set as a cylindrical cam and a leg portion abutted against the cylindrical cam may be formed for the CCD holder. Even with this construction, it is possible to perform focus adjustment through adjustment of the position of the lens-barrel in the optical axis direction by the action of the cylindrical cam and the leg portion.

On the other hand, the sensor holding portion 40 is a hole portion having a square pole shape that holds the CCD sensor 36 below the passage hole 42.

In the illustrated example, the CCD sensor 36 includes a CCD package 56 having a square pole shape and formed by sealing a light receiving portion 50 and the like, in which CCD elements are disposed, with partition walls 52 and a cover glass 54 on the partition walls 52, and a CCD substrate (mounting substrate) 58 on which the CCD package 56 is mounted. Also, an FPC (flexible printed circuit, i.e., wiring board) 60 is arranged on the lower surface of the CCD substrate 58, the CCD substrate 58 and the FPC (wiring board) 60 are connected with each other using means such as wire bonding or TAB bonding, and the CCD sensor 36 is mounted on the FPC 60.

In addition, in the sensor holding portion 40, an infrared cut filter 62 is arranged on the CCD sensor 36.

Next, as a preferable form of the image pickup module 10 according to the first aspect of the present invention, the characteristic portions of the image pickup module according to the third aspect of the present invention will be described below.

Incidentally, ordinarily, the CCD sensor is produced in the manner described below. First, many light receiving portions and the like that respectively correspond to CCD sensors are formed on a silicon wafer. Then, the silicon wafer is cut into rectangular chips respectively including the CCD sensors through dicing. Next, partition walls are formed on the chips. Finally, cover glass is placed on the partition walls for sealing of the light receiving portions and the like, thereby obtaining CCD packages.

Figure 4:
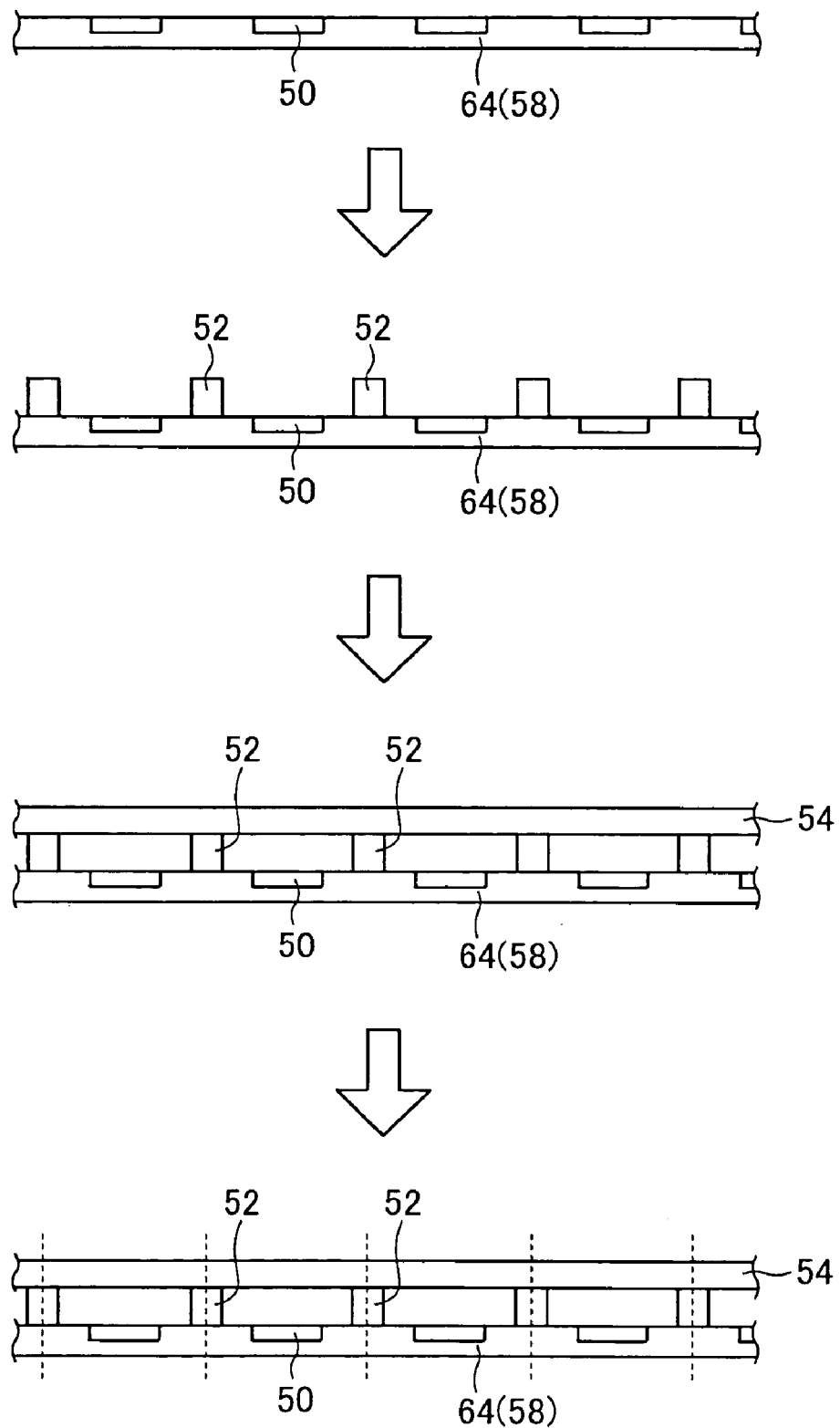
FIG. 4 is a schematic diagram illustrating a method of manufacturing a CCD sensor applied to the compact image pickup module shown in FIG. 1.

In contrast to this, the CCD sensor 36 in the illustrated example is produced in the manner schematically shown in FIG. 4. First, many light receiving portions 50 and the like respectively corresponding to CCD sensors are formed on a silicon wafer 64 (CCD substrate 58). Then, the partition walls 52 are formed in a lattice form or the like so as to correspond to the respective CCD sensors and the cover glass 54 is bonded so as to cover all of the CCD sensors (that is, packaging is performed using a sealing member). Next, dicing is performed so that the partition walls 52 are cut into half as indicated by dotted lines in the drawing, thereby obtaining the CCD sensors 36 that each include the CCD package 56 and the CCD substrate 58.

In the image pickup module 10 in this embodiment, as a preferable form, the CCD sensor 36 obtained in the manner described above is used, side surfaces of the CCD package 56, that is, cut surfaces obtained through the dicing (side surfaces of the cover glass 54 and the partition walls 52 in the illustrated example) are set as reference surfaces, and positioning of the CCD sensor 36 in a direction (light receiving surface direction, hereinafter referred to as "x-y direction") orthogonal to the optical axis is performed using the reference surfaces. As a more preferable form, positioning of the CCD sensor 36 in the optical axis direction is further performed by setting the upper surface of the CCD sensor 36 (upper surface of the cover glass 54 in the illustrated example) as a reference surface.

Figure 5:
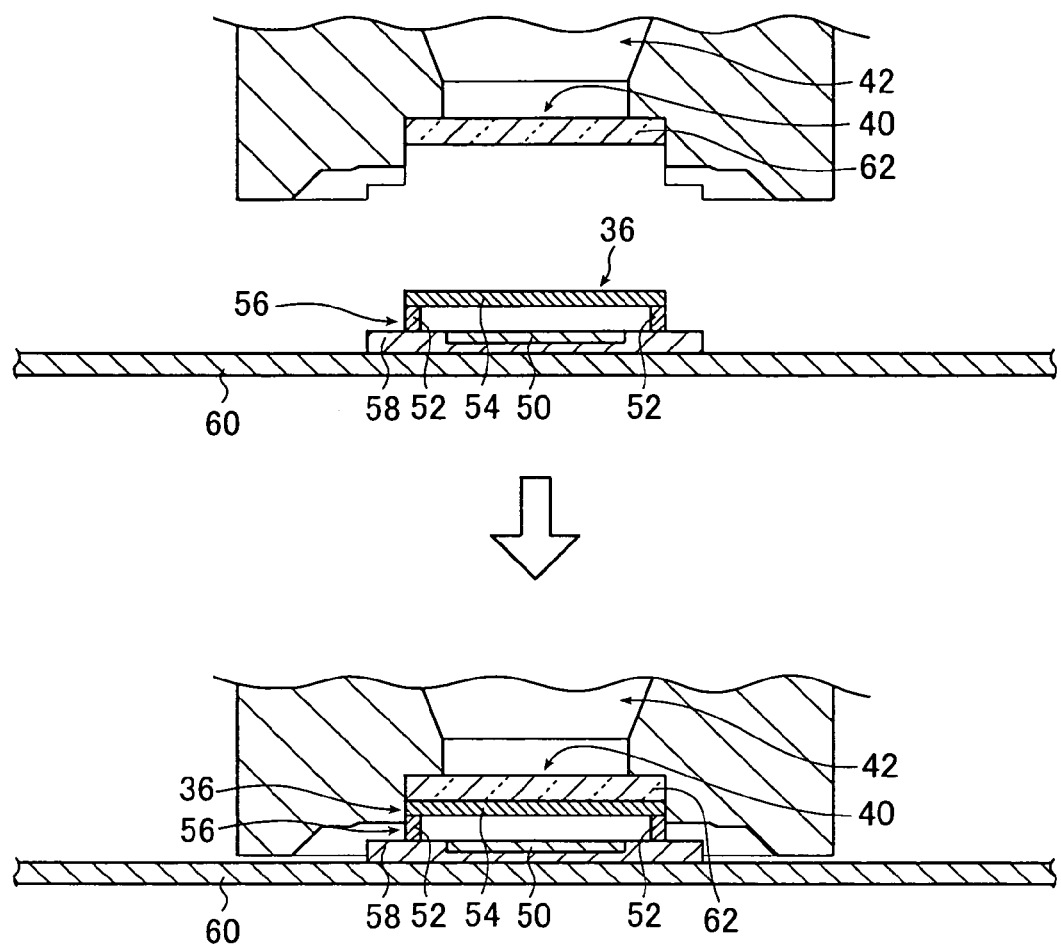
FIG. 5 is a schematic diagram illustrating an example of a method of assembling the compact image pickup module according to the present invention.

More specifically, in the illustrated example, the sensor holding portion 40 of the CCD holder 14 is formed so that the optical axis and the center of the light receiving portion 50 coincide with each other under a state in which the lens-barrel 18 is appropriately incorporated, and the side surfaces (obtained through dicing) of the CCD package 56 of the CCD sensor 36 are fitted to the sensor holding portion 40. As schematically shown in FIG. 5, the side surfaces of the CCD package 56 are fitted to the sensor holding portion 40 and the CCD sensor 36 is pushed therein until the entire upper surface of the cover glass 54 is abutted against the lower surface of the infrared cut filter 62, thereby incorporating the CCD sensor 36 into the CCD holder 14 while performing positioning in the x-y direction and the optical axis direction.

In the case of the ordinary CCD sensor produced by performing dicing, forming partition walls, and then performing sealing using cover glass, the accuracy of positional relations between the outer surfaces of the CCD package and the light receiving portion is insufficient, so the CCD sensor itself does not have a site that can be used as a reference surface for positioning.

Therefore, in the compact image pickup module that uses the ordinary CCD sensor, positioning is performed using the outer surfaces of the CCD package, that is, rough positioning is performed using the outer surfaces of the CCD package and the CCD sensor is incorporated into the CCD holder. In general, following this, the lens unit is incorporated into the CCD holder, after which a reference image is actually taken using the CCD sensor, and the lens unit is moved as necessary with reference to an image obtained through the photographing, thereby performing final positioning of the imaging lens and the CCD sensor (light receiving portion) in the x-y direction.

In contrast to this, in the case of the CCD sensor 36 of this embodiment produced by bonding the cover glass 54 and then performing dicing, the positional accuracy in the x-y direction of the side surfaces of the CCD package 56 (that is, the side surfaces of the cover glass 54 and the partition walls 52=surface formed through dicing) with respect to the light receiving portion 56 is extremely high.

As a result, with the construction where the side surfaces of the CCD package 56 are set as the reference surfaces in the x-y direction, the sensor holding portion 40 is formed so that the optical axis of the imaging lens 16 appropriately incorporated into the CCD holder 14 and the center of the light receiving portion 50 of the CCD sensor 36 coincide with each other, and the side surfaces of the CCD package 56 are fitted to the sensor holding portion 40, merely by incorporating the CCD sensor 36 into the CCD holder 14, it is possible to perform highly precise positioning in the x-y direction of the CCD sensor 36 (light receiving surface 50) with respect to the optical axis without performing fine positional adjustment such as adjustment based on an image obtained through photographing.

In addition, the CCD sensor 36 in the illustrated example produced by bonding the cover glass 54 and then performing dicing is also high in surface height accuracy and surface property of the cover glass 54 (CCD package 56).

Accordingly, it becomes possible to perform positioning in the optical axis direction by setting a surface of the cover glass 54 that is the upper surface of the CCD package 56 as the reference surface in the optical axis direction and abutting this surface against any member of the CCD holder 14. In particular, it becomes possible to accurately determine the position of the CCD sensor 36 (light receiving portion 50) in the optical axis direction and also to prevent inclination of the light receiving portion 50 with respect to the optical axis by performing positioning in the optical axis direction through abutment of the surface of the cover glass against a plane of the CCD holder 14 orthogonal to the optical axis (two-dimensionally against a plane in the x-y direction) such as the lower surface of the infrared cut filter 62 incorporated in advance.

As described above, in the image pickup module 10 in the illustrated example that uses the CCD sensor 36, surfaces formed through dicing are set at the side surfaces of the CCD package 56 and the side surfaces are used as the reference surfaces in the x-y direction at the time of incorporation of the CCD sensor 36.

On the other hand, in the illustrated example, the reference surface in the optical axis direction at the time of incorporation of the CCD sensor 36 is set at a photographing light incident surface integrated with the CCD sensor 36 at the time of incorporation into the CCD holder 14.

Accordingly, when the infrared cut filter is bonded onto the cover glass 54 and then dicing is performed to obtain the CCD sensor, which is incorporated into the CCD holder 14, for instance, a product also including the infrared cut filter is regarded as the CCD package, the side surfaces of the CCD package also including the side surfaces of the infrared cut filter are set as the reference surfaces in the x-y direction, and a surface of the infrared cut filter is set as the reference surface in the optical axis direction.

Alternatively, when the CCD sensor 36 is obtained through dicing, the infrared cut filter is placed on a surface of the cover glass 54, and then the CCD sensor 36 is incorporated into the CCD holder 14, only the side surfaces of the cover glass 54 and the partition walls 52 that do not include the side surfaces of the infrared cut filter are set as the side surfaces of the CCD package, the side surfaces are set as the reference surfaces in the x-y direction, and a surface of the infrared cut filter is set as the reference surface in the optical axis direction.

It should be noted here that a method of positioning the CCD sensor 36 in the image pickup module 10 in the illustrated example that uses the CCD sensor 36 obtained by performing the dicing after the bonding of the cover glass 54 is not limited to the method described above and it is possible to use various other methods including publicly known positioning methods such as the positioning method that uses an image obtained through photographing. For instance, the positioning in the x-y direction may be performed using the method described above and the positioning in the optical axis direction may be performed by setting a surface of not the CCD package 56 but the CCD substrate 58 as the reference surface.

That is, in the compact image pickup module according to the third aspect of the present invention, the method of positioning the CCD sensor 36 in the optical axis direction is not limited to the method in the illustrated example where the photographing light incident surface is set as the reference surface and various other methods are usable.

As an example, the positioning of the CCD sensor 36 in the optical axis direction may be performed by setting a surface (upper surface) of the mounting substrate 58 of the CCD sensor 36 as the reference surface in the optical axis direction and abutting the lower surface of the CCD holder 14 against the reference surface. Alternatively, in a like manner, the positioning of the CCD sensor 36 in the optical axis direction may be performed by setting a surface of the mounting substrate 58 as the reference surface in the optical axis direction, providing an abutment member for the lower surface of the CCD holder 14, and abutting the reference surface and the abutment member against each other.

As another method therefor, the positioning of the CCD sensor 36 in the optical axis direction may be performed by setting a surface of the substrate 60 on which the CCD sensor 36 is mounted as the reference surface in the optical axis direction and abutting the lower surface of the CCD holder 14 against the reference surface. Alternatively, in a like manner, the positioning of the CCD sensor 36 in the optical axis direction may be performed by setting a surface of the substrate 60 as the reference surface in the optical axis direction, providing an abutment member for the lower surface of the CCD holder 14, and abutting the reference surface and the abutment member against each other.

Also, in the illustrated example, as a preferable form, the positioning in the x-y direction and the incorporation of the CCD sensor 36 are performed by fitting the side surfaces of the CCD package 56 to the sensor holding portion 40. However, the present invention is not limited to this and the side surfaces of the CCD package 56 may be merely used as the reference surfaces for positioning in the x-y direction of the CCD sensor 36 and the incorporation of the CCD sensor 36 into the CCD holder 14 may be performed using any of publicly known as various incorporation methods for image pickup element such as holding using a jig.

Further, it is sufficient that surfaces formed through dicing are used for the reference surface in the x-y direction. For instance, in the illustrated example, only the side surfaces of the cover glass 54 may be set as the reference surfaces, only the side surfaces of the partition walls 52 may be set as the reference surfaces, or both of the side surfaces of the cover glass 54 and the partition walls 52 may be set as the reference surfaces.

At the time of assembling the image pickup module 10, first, as described above, the CCD package 56, preferably, the side surfaces thereof are fitted to the sensor holding portion 40 and the CCD package is pushed in until the cover glass 54 is entirely abutted against the infrared cut filter 62, thereby performing positioning, preferably, positioning in the x-y direction and in the optical axis direction and incorporating the CCD sensor 36 into the CCD holder 14. Following this, fixation is performed using an adhesive or the like.

On the other hand, the lens-barrel 18 is heated, each lens 22 is pushed into the lens-barrel 18 so as to reach a predetermined position and is incorporated so that the flange of each lens 22 is abutted against the lens-barrel 18 at the predetermined position. Then, after the lens-barrel 18 has returned to ordinary temperature, the lens retainer 20 is incorporated into the lens-barrel 18 and is fixed using an adhesive. In this manner, the lens unit 12 is produced.

Next, the lens-barrel 18 (lens unit 12) is fitted into the unit holding portion 38 of the CCD holder 14, is pressed in the downward direction, and is rotated while abutting the leg portion 24 against the cylindrical cam 44, thereby vertically moving the lens-barrel 18 and performing focus adjustment. Note that it is sufficient that this focus adjustment is performed using a publicly known method with which, for instance, a reference image is taken and the focus adjustment is performed while observing a reproduced image from the reference image.

After the lens unit 12 is fitted into the CCD holder 14 and the focus adjustment is performed in the manner described above, it is possible to finish the image pickup module 10 by fixing the lens unit 12 and the CCD holder 14 to each other through pouring of an adhesive from, for instance, an pouring portion formed in the CCD holder 14 as appropriate.

Here, it is preferable that the CCD sensor 36 described above be used in the image pickup module according to the third aspect of the present invention because it becomes possible to appropriately perform the positioning with respect to the optical axis and the incorporation of the image pickup element, such as the CCD sensor, through simple work where the necessity of adjustment using an image obtained through photographing or the like has been eliminated. In a like manner, it is preferable that the CCD sensor 36 described above be used in the image pickup module according to the first aspect of the present invention because it becomes possible to provide the same effects as above. However, the image pickup module according to the first aspect of the present invention is not limited to this. For instance, an ordinary CCD sensor obtained through bonding of cover glass or the like after dicing may be used and incorporated into the CCD holder by performing positioning of the CCD sensor using another positioning method, such as the positioning method described above that uses an image obtained through photographing, that is applied to a compact image pickup module.

It should be noted here that in the third aspect of the present invention, a construction is preferable in which the focus adjustment is performed using the cylindrical cam and the leg portion because, it becomes possible to use a simple construction, appropriately perform the focus adjustment, and prevent inclination of the optical axis like in the case of the image pickup module according to the first aspect of the present invention having the characteristic portions described above. However, the present invention is not limited to this and a construction may be used instead in which the lens-barrel is incorporated into the CCD holder through meshing of screw threads with each other and the focus adjustment is performed through adjustment of the screw-in amount of the lens-barrel like in the case of the well known ordinary compact image pickup module.

Next, the lens unit according to the fourth aspect of the present invention will be described in more detail.

As described above, in the lens unit 12 of the image pickup module 10 in the embodiment shown in FIG. 1, as schematically shown in FIGS. 2A and 2B using the lens 22b as a representative, the lenses 22 each have a circular shape (shape viewed in the optical axis direction) where the flange portion 23b is provided on the periphery of the lens portion 23b having optical action. In addition, the outer diameters of the lenses 22 (that is, the flange portions 23b) are equal to each other. Accordingly, by stacking the lenses 22 on each other in the optical axis direction, a columnar (straight-pipe)-shaped product is obtained. Also, molding has been performed so that by stacking the lenses 22 on each other so that the rims of the flange portions 23b coincide with each other and the flange portions 23b are in intimate contact with each other, the optical axes of the lenses 22 coincide with each other and intervals therebetween in the optical axis direction become appropriate.

The lens unit 12 is the lens unit according to the fourth aspect of the present invention and, as described above, the lens-barrel 18 has been molded so that the optical axes of the incorporated lenses 22 are appropriately positioned and has a columnar-shaped region (straight-pipe-shaped region) whose inner diameter is equal to the outer diameters of the lenses 22, with this region being set as the portion for holding the lenses 22. A clearance is created between the inner diameter of the lens-barrel 18 and the outer diameters of the lenses 22 by performing heating of the lens-barrel 18 and/or cooling of the lenses 22 and the three lenses 22 are incorporated so that the flange portions 23b of the lenses 22 are stacked on each other. As a result, when the lens-barrel 18 and/or the lenses 22 have/has returned to ordinary temperature (room temperature), the lenses are fixed to the lens-barrel 18 and there will never occur a situation where the lenses 22 move in the lens-barrel 18.

With the construction described above, in the lens unit composed of multiple lenses (combination lens), it becomes possible to incorporate the lenses 22 into the lens-barrel 18 while performing positioning of the lenses so that the optical axes of the lenses coincide with each other and also determining intervals between the lenses in the optical axis direction through simple work and also to more suitably suppress displacements (hereinafter referred to as "inter-lens eccentricity") between the optical axes of the lenses 22.

Here, in recent years, the plastic molding technique has been dramatically improved and it has become possible to perform highly precise molding for production.

As described above, the lens unit 12 in the illustrated example uses plastic lenses obtained through highly precise molding that has become possible as a result of the recent dramatic improvement of the plastic molding technique. To be specific, the lens unit 12 uses the lenses 22 that each have a circular shape where the flange portion 23b is provided on the periphery of the lens portion 23a, have the same outer diameter, and have a shape with which the optical axes coincide with each other when the lenses are disposed in the optical axis direction so that the rims of the flange portions 23b coincide with each other. The lens unit 12 is obtained by incorporating these lenses 22 into the lens-barrel 18 having an inner diameter that is equal to the outer diameters of the lenses 22. In other words, the lens-barrel 18 and the multiple lenses 22 are each set as a straight pipe member having the same diameter. With this construction, it becomes possible to substantially improve the workability of the lens-barrel 18.

Also, in the illustrated example, as a preferable form, the lenses 22 have shapes where the thicknesses (thicknesses in the optical axis direction) of the flange portions 23b are set so as to correspond to the positions of the lenses 22 in the optical axis direction, and the lenses 22 (lens portions 23a thereof) are set at predetermined positions in the optical axis direction when the lenses 22 are stacked on each other in the optical axis direction so that the flange portions 23b are in intimate contact with each other.

Here, as described above, in the lens unit 12, the outer diameters of the lenses 22 and the inner diameter of the lens-barrel 18 are set equal to each other. In such a case, no gap (clearance) exists between the lenses 22 and the lens-barrel 18, so an ideal state is obtained in which so-called backlash does not exist and the optical axes of the lenses 22 coincide with each other.

However, since no clearance exists between the lenses 22 and the lens-barrel 18, it is difficult to incorporate the lenses 22 into the lens-barrel 18 with an ordinary method. In addition, when the lenses 22 are forcedly incorporated into the lens-barrel 18, there occur problems that, for instance, it is impossible to obtain high positional accuracy in the optical axis direction and shavings of the lenses 22 and the lens-barrel 18 are generated. In particular, it is extremely difficult to incorporate the lens 22 under an appropriate state at the back of the lens-barrel 18 such as the position of the lens 22a.

In order to prevent such inconveniences, in the fourth aspect of the present invention, the lens-barrel 18 is heated and is increased in diameter through linear expansion before the lenses 22 are incorporated into the lens-barrel 18 to reach appropriate positions. Alternatively, the lenses 22 are cooled for shrinkage and are incorporated into the lens-barrel 18 to reach the appropriate positions. Still alternatively, both of the heating of the lens-barrel 18 and the cooling of the lenses 22 are performed to thereby increase the diameter of the lens-barrel 18 and shrink the lenses 22 and the lenses 22 are incorporated into the lens-barrel 18 to reach the appropriate positions.

For instance, after the lens-barrel 18 is heated and is increased in diameter, first, the lens 22a to be arranged at the deepest position is incorporated and its flange portion 23b is brought into intimate contact with the diaphragm 19. Next, the lens 22b is incorporated and its flange portion 23b is brought into intimate contact with the flange portion 23b of the lens 22a. Then, the lens 22c is incorporated and its flange portion 23b is brought into intimate contact with the flange portion 23b of the lens 22b.

Until the lens-barrel 18 has returned to its original diameter, the flange portion 23b of the lens 22a is kept in intimate contact with the diaphragm 19 and the flange portions 23b of the lenses 22 are kept in intimate contact with each other. When the lens-barrel 18 has been cooled and returned to its original diameter, the lens retainer 20 is incorporated into the lens-barrel 18 and when reaching a predetermined position, is fixed using an adhesive or the like.

With this method, a clearance is created between the lens-barrel 18 and the lenses 22 whose diameters are equal to each other, so the lenses 22 can be incorporated into the lens-barrel 18 to reach the appropriate positions without any force. Also, by setting the clearance therebetween at zero under the state where the lens-barrel 18 has returned to ordinary temperature, it becomes possible to fix the lenses 22 to the lens-barrel 18 under an ideal state where no backlash exists and the optical axes of the lenses 22 coincide with each other and to eliminate the inter-lens eccentricity. Further, it becomes possible to perform positioning of the lenses 22 in the optical axis direction.

It should be noted here that in this aspect, a situation where the outer diameters of the lenses 22 and the inner diameter of the lens-barrel 18 are equal to each other means that there is a sufficient clearance between the lenses 22 and the lens-barrel 18 to prevent the situation where there occurs a movement of the lenses 22 that leads to the inter-lens eccentricity in the lens-barrel 18 and a force that adversely affect optical performance is exerted on the lenses 22 when the lens-barrel 18 has returned to ordinary temperature and the lenses 22 are fixed in the lens-barrel 18.

When the clearance between the lenses 22 and the lens-barrel 18 is negative (that is, when the outer diameters of the lenses 22 are larger than the inner diameter of the lens-barrel 18), this results in tight fit. When the degree of the tight fit is too large, an adverse effect is exerted on the optical performance of the lenses 22. Conversely, when the clearance therebetween is positive, this results in clearance fit. When the clearance is too large, the lenses 22 move in the lens-barrel 18 and there occurs the inter-lens eccentricity. With consideration given to the points described above, the clearance between the lenses 22 and the lens-barrel 18 is preferably set at −10 to +5 μm, more preferably −5 to +2 μm, particularly preferably −2 to 0 μm in terms of the diameters. Note that generally, when the clearance between the lenses 22 and the lens-barrel 18 is set at +5 μm or less, incorporation using an ordinary method becomes difficult.

The lens unit according to the fourth aspect of the present invention is not limited to the lens unit in the example shown in FIG. 1 where the lenses 22 and the lens-barrel 18 each have a straight pipe shape. For instance, the outer diameters of the lenses 22 may be set different from each other or two of the lenses 22 may have the same outer diameter and one of the lenses 22 may have a different outer diameter.

For instance, a lens unit 12a shown in FIG. 6A is also suitable which includes an imaging lens 16a composed of three lenses 22d, 22e, and 22f, whose outer diameters are sequentially increased, and a lens-barrel 18a obtained by forming a lens holding portion whose inner diameter is changed in a step manner so as to correspond to the outer diameters of the lenses 22 of the imaging lens 16a. Note that, even in the case of the lens unit 12a, as a preferable form, positioning of the lenses in the optical axis direction is performed by stacking the lenses 22 on each other so that the flange portions thereof are in intimate contact with each other.

Alternatively, a lens unit 12b shown in FIG. 6B is also preferable which, in a like manner, includes an imaging lens 16b composed of a lens 22g and two lenses 22h and 22i, whose outer diameters are sequentially increased, and a lens-barrel 18b having a lens holding portion whose inner diameter is changed so as to correspond to the outer diameters of the lenses 22 of the imaging lens 16b, and having a convex portion that protrudes inwardly and is used for positioning of the lenses in the optical axis direction and is obtained by incorporating the uppermost lens 22g from above the lens-barrel 18b and incorporating the remaining lenses 22 from below the lens-barrel 18b.

The lens units 12, 12a, and 12b in the illustrated examples are each constructed using a combination lens composed of the three lenses 22 (such as the lenses 22a, 22b, and 22c), although the present invention is not limited to this. That is, as described above, there occurs no problem even when the number of the lenses 22 is changed to two or less or four or more.

Also, in the illustrated example, as a preferable form, the thickness of the flange portion 23b of each lens 22 is set at a thickness corresponding to the position of the lens 22 in the optical axis direction and the flange portions 23b are stacked on each other so as to be in intimate contact with each other, thereby also performing positioning in the optical axis direction. However, the present invention is not limited to this and the positioning of the lenses in the optical axis direction may be performed using another method with which, for instance, members such as spacers for performing positioning in the optical axis direction are arranged between the flange portions of the lenses.

It should be noted here that it is of course possible to apply the lens unit according to the fourth aspect of the present invention to the compact image pickup modules according to the first and second aspects of the present invention.

Next, a lens unit according to a fifth aspect of the present invention will be described in detail with reference to FIGS. 7 to 9.

Figure 7:
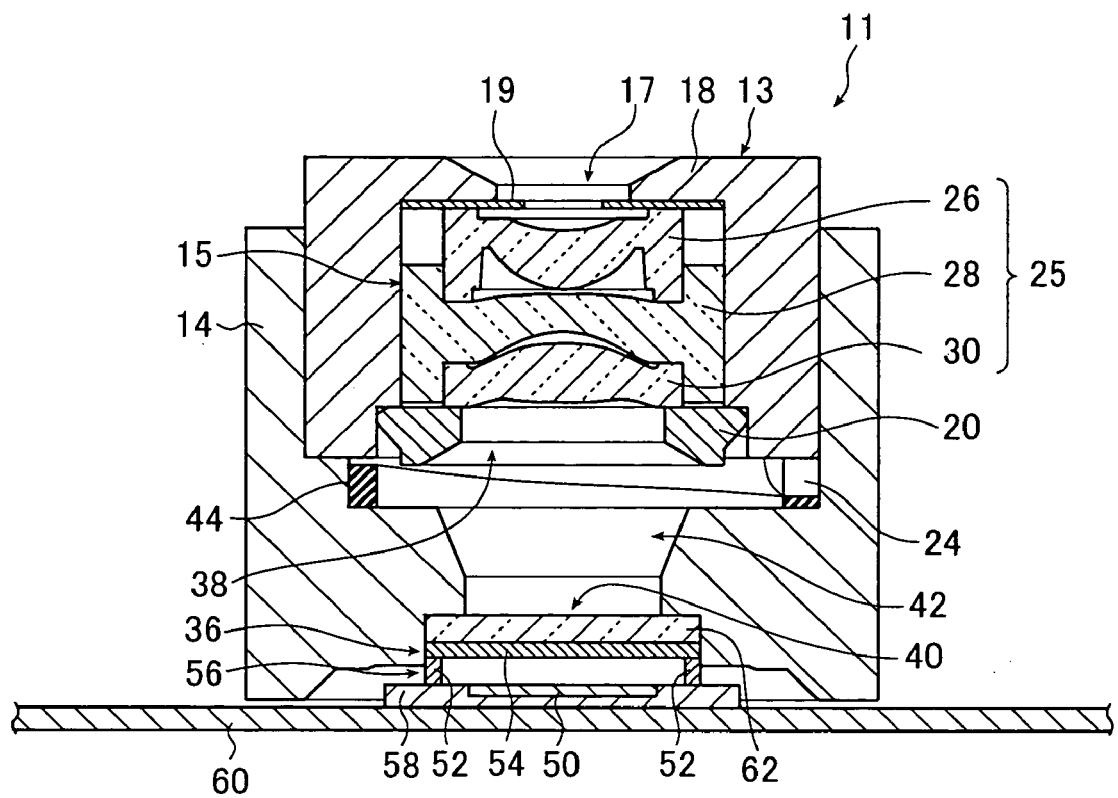
FIG. 7 is a schematic cross-sectional view of the compact image pickup module according to another embodiment of the present invention.

FIG. 7 is a schematic cross-sectional view of an embodiment of the compact image pickup module according to the first and second aspects of the present invention to which the lens unit according to the fifth aspect of the present invention is applied.

The compact image pickup module 11 shown in FIG. 7 has the same construction as the compact image pickup module 10 shown in FIG. 1 except that a lens unit 13 including an imaging lens 15 is provided in place of the lens unit 12 including the imaging lens 16. Therefore, each same construction element is given the same reference numeral and the detailed description thereof will be omitted.

The image pickup module 11 shown in FIG. 7 basically includes the lens unit 13 and a CCD holder 14.

In the image pickup module 11 in the illustrated example, the lens unit 13 is the lens unit according to the present invention and includes the imaging lens 15 and a lens-barrel 18, preferably, further includes a lens retainer 20 and a diaphragm 19.

As shown in FIG. 8, the imaging lens 15 is composed of three lenses 25 that are a lens 26, a lens 28, and a lens 30.

As conceptually shown in FIGS. 9A and 9B with reference to the lens 28, the lens 26 is constructed from a lens portion 26a and a flange portion 26b, the lens 28 is constructed from a lens portion 28a and a flange portion 28b, and the lens 30 is constructed from a lens portion 30a and a flange portion 30b, with each of the lenses 26, 28, and 30 having a circular shape (shape viewed in the optical axis direction).

In the illustrated example, it is possible to fit the flange portion 26b of the lens 26 to (into) the upper inside (optical axis side) surface of the flange portion 28b of the lens 28 and it is possible to fit the flange portion 30b of the lens 30 to the lower inside surface of the flange portion 28b of the lens 28.

The imaging lens 15 is assembled by fitting the flange portion 26b of the lens 26 to the flange portion 28b of the lens 28 from above the lens 28, abutting the flange surface (surface in the optical axis direction) of the flange portion 28b against the upper surface of the lens portion 28a, fitting the flange portion 30b of the lens 30 to the flange portion 28b of the lens 28 from below the lens 28, and abutting the flange surface of the flange portion 30b against the lower surface of the lens portion 28a.

Each lens 25 (26, 28, and 30) has a shape with which under an assembled state where the flange portions (26b, 28*b*, and 30*b*) of the lenses are fitted to each other in the manner described above, the optical axes of the lenses coincide with each other. In the illustrated example, as a preferable form, each lens has a shape with which the positional relations between the lenses in the optical axis direction also become appropriate under the assembled state.

The lens unit according to the present invention has such a construction, so merely by assembling the lenses through fitting of the flange portions of the lenses to each other, it is possible to perform alignment of the optical axes of the lenses and also perform positioning thereof in the optical axis direction. In addition, it is possible to prevent displacements (hereinafter referred to as "inter-lens eccentricity") between optical axes of the lenses.

The lens unit according to the fifth aspect of the present invention has the construction described above. Therefore, the lenses are each formed in a shape with which it is possible to combine the lenses with each other through fitting of the flange portions of the lenses to each other and the optical axes of the lenses coincide with each other under a state where the lenses are combined with each other through the fitting of the flange portions to each other. Preferably, the lenses each also have a shape with which the thickness (thickness in the optical axis direction) of the flange portion of each lens is set at a thickness corresponding to the position of the lens in the optical axis direction under the combined state and the position of the lens in the optical axis direction also becomes appropriate under the combined state where the flange portions are fitted to each other. By combining such lenses with each other, the imaging lens 15 is formed.

As a result, with the lens unit according to the fifth aspect of the present invention, merely by combining the lenses 26, 28, and 30 with each other through fitting of the flanges of the lenses to each other, it is possible to obtain the imaging lens 15 where positioning in a direction (hereinafter referred to as "x-y direction") orthogonal to the optical axes has been performed so that the optical axes of the lenses coincide with each other, preferably, positioning in the optical axis direction also has been performed. In addition, after the lenses are combined with each other, it is possible to deal with the lenses in the same manner as a single lens, so it also becomes possible to prevent the inter-lens eccentricity after the combining.

Here, as to the lenses 26, 28, and 30, like in the case of the lens unit according to the fourth aspect described above, it is preferable that no mold seam (mold parting line) exist on surfaces abutted against each other in the optical axis direction and surfaces abutted against each other in the x-y direction, that is, reference surfaces for positioning the lenses. In other words, it is preferable that molding of the lenses be performed using lens molds produced by creating seam surfaces at positions outside the reference surfaces so that no parting line exists on the reference surfaces.

In particular, it is preferable that the molding of the lenses be performed so that no parting line exist on surfaces (reference surfaces) for performing positioning in the optical axis direction such as surfaces of the flange portion 26*b* of the lens 26 and the lens portion 28*a* of the lens 28 that are abutted against each other and surfaces of the flange portion 30*b* of the lens 30 and the lens portion 28*a* of the lens 28 that are abutted against each other.

As described above, the optical axes of the lenses 26, 28, and 30 constituting the imaging lens 15 are set so as to coincide with each other and positioning of the lenses in the optical axis direction is performed by performing positioning in the optical axis direction and the x-y direction through fitting of the flange portions of the lenses to each other and abutment of the flange portions and the lens portions of the lenses against each other. Consequently, when a parting line exists on the reference surfaces, this results in a possibility that an error will occur to the positional relations between the lenses and positional displacements in the optical axis direction or the inter-lens eccentricity will occur.

That is, it becomes possible to produce a more highly precise imaging lens that is a combination lens by obtaining reference surfaces that contains no parting line.

It should be noted here that when there is a high possibility that the shapes of the lenses will become complicated like in the case of the present invention, formation of the mold seam surfaces in portions continuing to the reference surfaces is advantageous in terms of molding precision and production convenience in many cases.

A suitably used method for forming a parting line outside the reference surfaces involves the use of means for providing corner portions continuing to the reference surfaces with curved (rounded) surfaces to thereby form seam surfaces at the positions of the curved surfaces, or means for providing corner portions continuing to the reference surfaces with a notched shape to thereby form seam surfaces at the positions of the notched corner portions, or the like.

In the illustrated example, although the imaging lens 15 is constructed using the three lenses 25 (26, 28, and 30), the present invention is not limited to this. That is, there occurs no problem even when the number of the lenses is changed to two or less or four or more.

Also, the lenses (lens portions and flange portions) 25 are not limited to those of circular shapes and may have various other shapes so long as fitting of the lenses to each other is possible.

In addition, in the illustrated example, as a preferable form, the thickness of the flange portion of each lens is set at a thickness corresponding to the position of the lens in the optical axis direction. With this construction, positioning in the optical axis direction is also performed through abutment of the flange portions and the lens portions against each other. However, the present invention is not limited to this. For instance, the positioning of each lens in the optical axis direction may be performed with a method with which members for performing the positioning in the optical axis direction, such as spacers, are arranged between the abutment portions.

A method of incorporating the imaging lens 15 into the lens-barrel 18 is not specifically limited.

As described above, although the imaging lens 15 is constructed using the three lenses 26, 28, and 30, it is possible to deal with the imaging lens 15 as a single lens, so it is sufficient that with a publicly known method of incorporating an ordinary single lens into a lens-barrel, the imaging lens 15 is incorporated into the lens-barrel 18 and is pressed by incorporating the lens retainer 20 and the lens retainer 20 is fixed using an adhesive or the like.

Also, as another method, it is possible to cite the following method as an example.

A portion of the imaging lens 15 having the maximum diameter (in the illustrated example, the lens 28 (flange portion thereof) having the maximum diameter) is formed in a cylindrical shape (straight pipe shape), the imaging lens 15 accommodation portion of the lens-barrel 18 is formed in a columnar shape having the same diameter as (up to +5 μm is possible) that of the imaging lens 15, the imaging lens 15 is fitted and incorporated into the lens-barrel 18 and then the incorporated imaging lens 15 is fixed at a predetermined position using the lens retainer 20. With this construction, it becomes possible to prevent movement of the imaging lens 15 in the lens-barrel 18 and inclination of the optical axes due to inclination of the imaging lens 15.

With this construction, however, there are many cases where it is difficult to incorporate the imaging lens 15 into the lens-barrel 18. Therefore, it is preferable that heating of the lens-barrel 18 and/or cooling of the imaging lens 15 be performed, the diameter of the lens-barrel 18 be increased through linear expansion and/or the imaging lens 15 be shrunken through the cooling, the imaging lens 15 be incorporated into the lens-barrel 18 under this state so as to reach a predetermined position, the incorporated imaging lens 15 be held until temperature falls to the extent that the lens-barrel 18 and/or the imaging lens 15 have/has returned to ordinary size, and then the imaging lens 15 be fixed using the lens retainer 20.

Similarly, when the imaging lens 15 is obtained by combining the lenses 26, 28, and 30 with each other, such a method that utilizes heating and/or cooling is usable.

The CCD holder 14 is a tubular member (in the illustrated example, the upper portion has a cylindrical shape and the lower portion has a square tubular shape) that holds the lens unit 13 (that is, the lens-barrel 18) described above and the CCD sensor 36, with a unit holding portion 38 that holds the lens unit 13 being formed in the upper portion, a sensor holding portion 40 that holds the CCD sensor 36 being formed in the lower portion, and a photographing light passage hole 42 being formed through which the holding portions communicate with each other. Here, the constructions of the CCD holder 14, the CCD sensor 36, the unit holding portion 38, the sensor holding portion 40, and the like have already been described above and therefore will not be explained again.

It should be noted here that the reference surfaces in the x-y direction are not limited to the side surfaces of the cover glass 54 and the partition walls 52 and it is sufficient that surfaces formed through dicing are used for the reference surface. In the illustrated example, only the side surfaces of the cover glass 54 may be set as the reference surfaces. Also, only the side surfaces of the partition walls 52 may be set as the reference surfaces. Further, both of the side surfaces of the cover glass 54 and the partition walls 52 may be set as the reference surfaces. Still further, when dicing was performed after the infrared cut filter was bonded onto the cover glass 54, the side surfaces of the cover glass 54 may be set as the reference surfaces.

Also, it is sufficient that the reference surface in the optical axis direction is set at a photographing light incident surface integrated with the CCD sensor 36 at the time of incorporation into the CCD holder 14. Therefore, for instance, when the CCD sensor 36 was incorporated into the CCD holder 14 after the infrared cut filter was bonded onto the cover glass 54, a surface of the infrared cut filter may be set as the reference surface in the optical axis direction.

At the time of assembling the image pickup module 11, first, as described above, the CCD sensor 36 is incorporated into the CCD holder 14 by fitting the CCD package 56 to the sensor holding portion 40 and pushing the CCD package 56 into the CCD holder 14 until the cover glass 54 is entirely abutted against the infrared cut filter 62, thereby performing positioning and incorporation of the CCD sensor 36 into the CCD holder 14. Then, the CCD sensor 36 is fixed using an adhesive or the like.

On the other hand, the lens unit 13 is produced in the manner described below. First, as described above, the flange portion 26*b* of the lens 26 and the flange portion 30*b* of the lens 30 are fitted to (fitted into) the flange portion 28*b* of the lens 28 and the flange portion 26*b* and the flange portion 30*b* are abutted against the lens portion 28*a* of the lens 28, thereby obtaining the imaging lens 15. Then, the imaging lens 15 is incorporated into the lens-barrel 18 and the lens retainer 20 is incorporated into the lens-barrel 18 and is fixed using an adhesive, thereby producing the lens unit 13.

Next, the lens-barrel 18 (lens unit 13) is fitted into the unit holding portion 38 of the CCD holder 14 and is rotated while abutting the leg portion 24 against the cylindrical cam 44 through pressing in the downward direction, thereby vertically moving the lens-barrel 18 and performing focus adjustment. Note that it is sufficient that the focus adjustment is performed using a publicly known method with which, for instance, a reference image is taken and the focus adjustment is performed while observing a reproduced image from the reference image.

After the lens unit 13 is fitted into the unit holding portion 38 and the focus adjustment is performed in the manner described above, the lens unit 13 and the CCD holder 14 are fixed to each other by, for instance, pouring an adhesive from an pouring portion formed in the CCD holder 14 as appropriate, thereby finishing the image pickup module 11.

It should be noted here that as a matter of course, the lens unit according to the fifth aspect of the present invention is also applicable to the compact image pickup modules according to the first and second aspects of the present invention and other compact image pickup modules.

Next, a compact image pickup module according to a second aspect of the present invention will be described with reference to FIG. 10.

Figure 10:
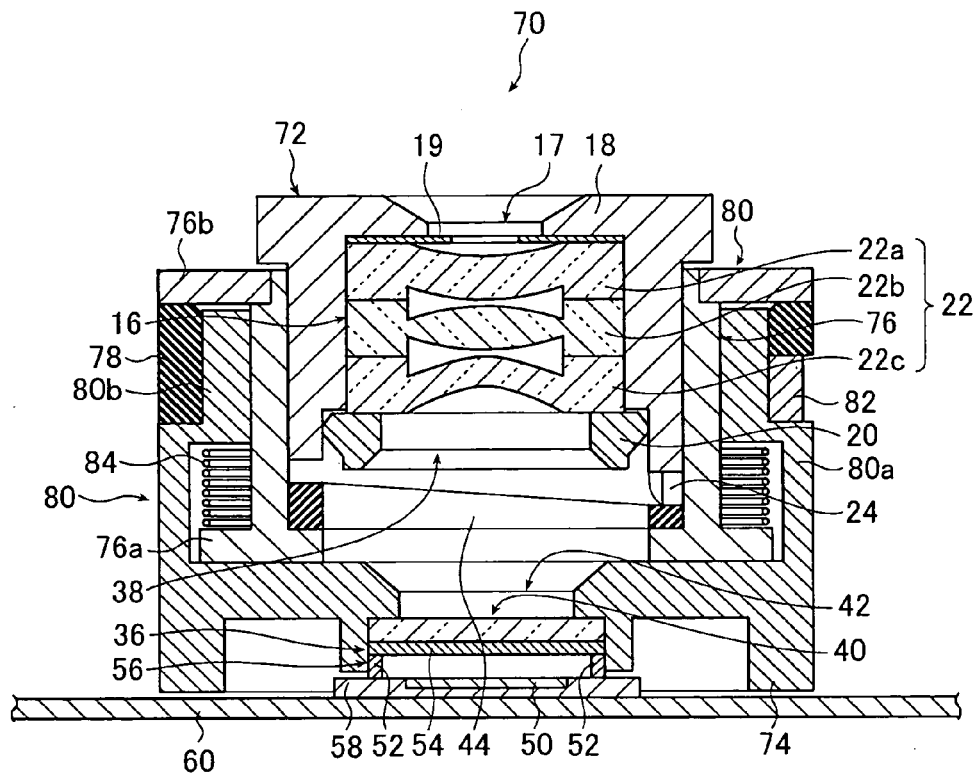
FIG. 10 is a schematic cross-sectional view of the compact image pickup module according to still another embodiment of the present invention.

FIG. 10 is a schematic cross-sectional view (cross-sectional view taken along a plane containing the optical axis as above) of the compact image pickup module according to the second aspect of the present invention.

The compact image pickup module (hereinafter referred to as "image pickup module") 70 has a macro photographing function (close-up photographing function). Note that the image pickup module 70 shown in FIG. 10 has basically the same construction as the image pickup module 10 shown in FIG. 1 except that the image pickup module 70 has the macro photographing function. Therefore, each same construction element is given the same symbol and the detailed description thereof will be omitted. That is, in the following description, each different site will be mainly explained.

Like the image pickup modules described above, the image pickup module 70 includes a lens unit 72 that holds an imaging lens 16 and a CCD holder 74 that holds a CCD sensor 36.

Also, the lens unit 72 includes the imaging lens 16, a lens-barrel 18 that holds the imaging lens 16, and a macro switching member 76 into which the lens-barrel 18 is fitted and which fixes the lens-barrel 18 (that is, the lens unit 72 includes the lens-barrel 18 and the switching member 76).

The macro switching member 76 (hereinafter referred to as "switching member 76") holds the lens-barrel 18 and switches the position of the imaging lens 16 (lens unit 72) in the optical axis direction in accordance with which one of macro photographing and ordinary photographing is to be performed.

Here, in the image pickup module 70 shown in FIG. 7, focus adjustment which uses a cylindrical cam 44 and a leg potion 24 that are the same as those of the image pickup module 10 shown in FIG. 1, is performed by the action of the switching member 76 and the lens-barrel 18.

That is, in the image pickup module 70, the cylindrical cam 44 for the focus adjustment is formed for the switching member 76 and the lens-barrel 18 is fitted into the switching member 76 so as to be rotatable about the optical axis and movable in the optical axis direction.

In the image pickup module 70, under a state where the lens unit 72 is incorporated into the CCD holder 74 so as to reach a predetermined position, the imaging lens 16 is set at a position for ordinary photographing, for instance. Next, in the same manner as in the case of the image pickup module 10 shown in FIG. 1 described above, focus adjustment is performed by vertically moving the lens-barrel 18 in the switching member 76 by the action of the cylindrical cam 44 and the leg portion 24 through rotation of the lens-barrel 18. After the focus adjustment is performed, the lens-barrel 18 is fixed to the switching member 76 using an adhesive.

As described above, the switching member 76 has the cylindrical cam 44 for the focus adjustment in a lower portion and is a cylindrical member into which the lens-barrel 18 is fitted. Also, the switching member 76 includes a circular flange portion 76a whose center is set at the optical axis, at the lower end and has a circular flange portion 76b whose center is also set at the optical axis, at the upper end.

In addition, a cylindrical cam 78 for macro photographing (for photographing distance switching) is fixed to the outer peripheral portion of the lower surface of the flange portion 76b. The cylindrical cam 78 has a semicircular annular cam surface whose center is set at the optical axis, on its lower surface and gradually increases in height (that is, the cam surface is lowered) in a circumferential direction. Note that in the illustrated example, the cylindrical cam 78 gradually increases in height from the right to the left (in a clockwise direction) in the drawing.

On the other hand, the CCD holder 74 has a cylindrical lens unit accommodation portion 80 as well as a sensor holding portion 40 that is the same as above.

The lens unit accommodation portion 80 has a shape where a cylindrical portion 80b having a smaller diameter is placed on a cylindrical portion 80a having a larger diameter, and holds the lens unit 72 (switching member 76) so as to be rotatable about the optical axis through insertion of the cylindrical portion 80b having the smaller diameter into the cylindrical cam 78 of the switching member 76.

Also, outside a step portion between the cylindrical portion 80a and the cylindrical portion 80b, an abutment member 82 that is abutted against the cylindrical cam 78 for macro photographing is arranged.

In addition, the image pickup module 70 includes a coil spring 84 into which the switching member 76 is inserted.

The coil spring 84 is arranged so as to be abutted against the upper surface of the flange portion 76a at the lower end of the switching member 76 and the lower surface of the step portion of the cylinder in the lens unit accommodation portion 80, and urges both of the surfaces, that is, the switching member 76 (lens unit 72) and the CCD holder 74 in a direction in which the distance therebetween is increased. As a result, in the CCD holder 74, the lens unit 72 is placed under a state where it is urged by the coil spring 84 in the downward direction.

Under the state shown in FIG. 10, the abutment member 82 of the CCD holder 74 (lens unit accommodation portion 80) is abutted against the cylindrical cam 78 at the position at which the cam 78 has the minimum height (highest position in the vertical direction of the cylindrical cam 78). This state is for the ordinary photographing in which the distance between the CCD sensor 36 and the imaging lens 16 becomes the minimum.

When the switching member 76 is rotated in the clockwise direction from this state, the height of the cam surface of the cylindrical cam 78 against which the abutment member 82 is abutted, gradually increases, so the lens unit 72 is elevated by the action of the cylindrical cam 78 and the abutment member 82. Following this, when the lens unit 72 has reached the highest position, the state for the macro photographing is obtained in which the distance between the CCD sensor 36 and the imaging lens 16 becomes the maximum.

Conversely, when the switching member 76 is rotated in the counterclockwise direction, the height of the cam surface of the cylindrical cam 78 against which the abutment member 82 is abutted, gradually decreases. Here, the lens unit 72 is urged by the coil spring 84 in the downward direction. Therefore, the lens unit 72 moves in the downward direction and returns to the lowest position, that is, the ordinary photographing state shown in FIG. 10 from the macro photographing state.

The macro photographing function in the conventional compact image pickup module is realized using multiple springs, so the number of components is large. Also, multiple springs are used, so there is a possibility that the lens unit will be inclined due to differences in urging force between the springs or the like. As a result, there is a high possibility that inconveniences will occur in which, for instance, the optical axis of the imaging lens is inclined or the lens unit is hitched in the CCD holder and therefore the movement of the lens unit becomes unstable or impossible. Conversely, in order to ensure stability of the movement of the lens unit, it is required to obtain a large clearance between the lens unit and the CCD holder. In this case, however, a possibility of image quality reduction ascribable to inclination of the optical axis or the like is increased.

In contrast to this, in the image pickup module 70 according to this aspect, the macro photographing function is realized with the cylindrical cam 78 and one coil spring 84 into which the lens unit 70 is inserted. As a result, it becomes possible to reduce the number of components, eliminate various inconveniences due to differences between multiple springs resulting from the use of the multiple springs, realize stabilized movement, and perform ordinary photographing and macro photographing of high-quality images where image quality degradation ascribable to inclination of the optical axis or the like does not exist.

Although the lens unit and compact image pickup module according to the present invention have been described in detail above, the present invention is not limited to the embodiments described above and it is of course possible to make various modifications and changes without departing from the gist of the present invention.

For instance, although each of the examples described above is an example where one of the lens units according to the fourth and fifth aspects of the present invention or both are applied to one of the compact image pickup modules according to the first to third aspects of the present invention, the present invention is not limited to this and the lens units are of course applicable to other compact image pickup modules and are also suitably applicable to the imaging optical systems or the like of various optical devices such as a lens-fitted film.

What is claimed is:

1. A compact image pickup module comprising:
an imaging lens;
a cylindrical lens-barrel that holds said imaging lens;
an image pickup element;
an image pickup element holder which holds said image pickup element and into which said lens-barrel is fitted so as to be rotatable about an optical axis of said imaging lens and movable in a direction of said optical axis of said imaging lens;

a cylindrical cam which has as an upper surface or a lower surface thereof, an annular cam surface whose center is set at the optical axis of said imaging lens and which is formed in one of said lens-barrel and said image pickup element holder; and an abutment member which is abutted against said annular cam surface of said cylindrical cam under a state where said lens-barrel is fitted into said image pickup element holder and which is formed in the other of said lens-barrel and said image pickup element holder, wherein, after focusing is performed through relative rotation of said lens-barrel and said image pickup element holder, said lens-barrel and said image pickup element holder are fixed to each other.

2. The compact image pickup module according to claim 1, wherein said image pickup element is obtained through dicing into each element after packaging with a sealing member on a silicon wafer is finished, said image pickup element holder has a lens-barrel holding portion that holds said lens-barrel and an element holding portion that holds said image pickup element, and positioning of said image pickup element in a direction orthogonal to said optical axis of said imaging lens is performed in said element holding portion of said image pickup element holder by setting a surface formed through dicing of said image pickup element as a reference surface and then said element holding portion of said image pickup element holder holds said image pickup element.

3. The compact image pickup module according to claim 1, wherein said imaging lens includes multiple lenses, said lens-barrel has a lens holding region; and after at least one of heating of said lens-barrel and cooling of said multiple lenses is performed, said multiple lenses are incorporated into said lens holding region of said lens-barrel, and said multiple lenses are fixed to said lens-barrel when said lens-barrel and said multiple lenses have returned to ordinary temperature.

4. The compact image pickup module according to claim 1, wherein said imaging lens includes multiple lenses combined with each other, each lens having a lens portion having optical action and a flange portion on the periphery of said lens portion, and said flange portion of one lens of said multiple lenses is capable of being fitted to said flange portion of at least one of other lenses, and each lens has a shape with which an optical axis of said one lens coincides with said optical axis of said at least one of the other lenses under a combined state where said one lens is combined with said at least one of the other lenses through fitting of flange portions to each other.

5. A compact image pickup module comprising;

an imaging lens;

a cylindrical lens holder whose outer wall surface has a first convex portion formed thereon and which holds said imaging lens;

an image pickup element;

an image pickup element holder which holds said image pickup element, into which said cylindrical lens holder is inserted so as to be rotatable about an optical axis of said imaging lens and movable in a first direction of said optical axis direction of said imaging lens, and whose inner wall surface has a second convex portion formed thereon;

a coil spring that engages with said first convex portion of said cylindrical lens holder and said second convex portion of said image pickup element holder and biases said lens holder and said image pickup element holder in a second direction in which a distance therebetween is increased;

a first cylindrical cam that has as an upper surface or a lower surface thereof, an annular cam surface whose center is set at said optical axis of said imaging lens and which gradually increases in height in a circumferential direction, and that is formed in one of said cylindrical lens holder and said image pickup element holder; and an abutment member that is abutted against said annular cam surface of said first cylindrical cam under a state where said cylindrical lens holder is inserted into said image pickup element holder and that is formed in the other of said cylindrical lens holder and said image pickup element holder.

6. The compact image pickup module according to claim 5, wherein said cylindrical lens holder comprises:

a lens-barrel that holds said imaging lens in a fixed manner; and a photographing distance switching member into which the lens-barrel is fitted so as to be rotatable about said optical axis of said imaging lens and movable in said first direction of said optical axis direction of said imaging lens, wherein said compact image pickup module further comprises:

a second cylindrical cam that has as an upper surface or a lower surface thereof, an annular cam surface whose center is set at said optical axis of said imaging lens and that is formed in one of said lens-barrel and said photographing distance switching member; and a second abutment member that is abutted against said annular cam surface of said second cylindrical cam under a state where said lens-barrel is fitted into said image pickup element holder and that is formed for the other of said lens-barrel and said photographing distance switching member, and wherein, after focusing is performed by adjusting a distance between said imaging lens and said image pickup element in said first direction of said optical axis through relative rotation of said lens-barrel and said photographing distance switching member, said lens-barrel and said photographing distance switching member are fixed to each other.

7. The compact image pickup module according to claim 5, wherein said image pickup element is obtained through dicing into each element after packaging with a sealing member on a silicon wafer is finished, said image pickup element holder has a lens holding portion that holds said cylindrical lens holder and an element holding portion that holds said image pickup element, and positioning of said image pickup element in a direction orthogonal to said optical axis of said imaging lens is performed in said element holding portion of said image pickup element holder by setting a surface formed through dicing of said image pickup element as a reference surface and then said element holding portion of said image pickup element holder holds said image pickup element.

8. The compact image pickup module according to claim 5, wherein
said imaging lens includes multiple lenses, said lens-barrel has a lens holding region; and
after at least one of heating of said lens-barrel and cooling of said multiple lenses is performed, said multiple lenses are incorporated into said lens holding region of said lens-barrel, and said multiple lenses are fixed to said lens-barrel when said lens-barrel and said multiple lenses have returned to ordinary temperature.

9. The compact image pickup module according to claim 5, wherein
said imaging lens includes multiple lenses combined with each other, each lens having a lens portion having optical action and a flange portion on the periphery of said lens portion, and
said flange portion of one lens of said multiple lenses is capable of being fitted to said flange portion of at least one of other lenses, and each lens has a shape with which an optical axis of said one lens coincides with said optical axis of said at least one of the other lenses under a combined state where said one lens is combined with said at least one of the other lenses through fitting of flange portions to each other.

10. A compact image pickup module comprising:
an imaging lens;
a lens-barrel that holds said imaging lens;
an image pickup element that is obtained through dicing into each element after packaging with a sealing member on a silicon wafer is finished; and
an image pickup element holder that has a lens-barrel holding portion that holds said lens-barrel and an element holding portion that holds said image pickup element,
wherein positioning of said image pickup element in a direction orthogonal to an optical axis of said imaging lens is performed in said element holding portion of said image pickup element holder by setting a surface formed through dicing of said image pickup element as a reference surface and then said element holding portion of said image pickup element holder holds said image pickup element.

11. The compact image pickup module according to claim 10, wherein said positioning of said image pickup element in said direction orthogonal to said optical axis of said imaging lens is performed through fitting said surface formed through dicing of said image pickup element to said element holding portion of said image pickup element holder and then said element holding portion of said image pickup element holder holds said image pickup element.

12. The compact image pickup module according to claim 10, wherein said element holding portion of said image pickup element has a site that is abutted against a photographing light incident surface of said image pickup element, and said positioning of said image pickup element in a direction of said optical axis of said imaging lens is performed through abutment of said site against said photographing light incident surface.

13. The compact image pickup module according to claim 10, wherein said element holding portion of said image pickup element has a site that is abutted against a surface of a mounting substrate of said image pickup element, and said positioning of said image pickup element in a direction of said optical axis of said imaging lens is performed through abutment of said site against said surface of said mounting substrate of said image pickup element.

14. The compact image pickup module according to claim 10, wherein said element holding portion of said image pickup element has a site that-is abutted against a surface of a wiring board of said image pickup element, and said positioning of said image pickup element in a direction of said optical axis of said imaging lens is performed through abutment of said site against said surface of said wiring board of said image pickup element.

15. The compact image pickup module according to claim 10, wherein
said imaging lens includes multiple lenses, said lens-barrel has a lens holding region; and
after at least one of heating of said lens-barrel and cooling of said multiple lenses is performed, said multiple lenses are incorporated into said lens holding region of said lens-barrel, and said multiple lenses are fixed to said lens-barrel when said lens-barrel and said multiple lenses have returned to ordinary temperature.

16. The compact image pickup module according to claim 10, wherein
said imaging lens includes multiple lenses combined with each other, each lens having a lens portion having optical action and a flange portion on the periphery of said lens portion, and
said flange portion of one lens of said multiple lenses is capable of being fitted to said flange portion of at least one of other lenses, and each lens has a shape with which an optical axis of said one lens coincides with said optical axis of said at least one of the other lenses under a combined state where said one lens is combined with said at least one of the other lenses through fitting of flange portions to each other.

17. A lens unit comprising:
a tubular lens-barrel having a lens holding region; and
multiple lenses held by said lens-barrel,
wherein, after at least one of heating of said tubular lens-barrel and cooling of said multiple lenses is performed, said multiple lenses are incorporated into said lens holding region of said tubular lens-barrel, and said multiple lenses are fixed to said tubular lens-barrel when said tubular lens-barrel and said multiple lenses have returned to ordinary temperature.

18. The lens unit according to claim 17, wherein each of said multiple lenses has a lens portion having optical action and a flange portion on the periphery of said lens portion, said multiple lenses are stacked on each other in said tubular lens-barrel by bringing flange portions of said multiple lenses into intimate contact with each other, and positional relations between said multiple lenses in an optical axis direction become appropriate under a stacked state of said multiple lenses.

19. A lens unit comprising:
multiple lenses combined with each other, each lens having a lens portion having optical action and a flange portion on the periphery of said lens portion,
wherein said flange portion of one lens of said multiple lenses is capable of being fitted to said flange portion of at least one of other lenses, and each lens has a shape with which an optical axis of said one lens coincides with said optical axis of said at least one of the other lenses under a combined state where said one lens is combined with said at least one of the other lenses through fitting of flange portions to each other.

20. The lens unit according to claim 19, wherein each lens of said multiple lenses has a shape with which a position of each lens in a direction of said optical axis becomes appropriate under said combined state where said one lens is combined with said at least one of the other lenses through fitting of flange portions to each other.

21. The lens unit according to claim 19, wherein each lens of said multiple lenses is a lens formed through injection molding and no mold seam exist on at least one of contact surfaces of lenses being contact with each other in a direction of said optical axis under said combined state and contact surfaces of lenses being contact with each other in a direction orthogonal to said optical axis under said combined state.

22. The lens unit according to claim 19, further comprising:
   a tubular lens-barrel having a lens holding region,
   wherein said multiple lenses are held by said lens-barrel, and
   wherein, after at least one of heating of said tubular lens-barrel and cooling of said multiple lenses is performed, said multiple lenses are incorporated into said lens holding region of said tubular lens-barrel, and said multiple lenses are fixed to said tubular lens-barrel when said tubular lens-barrel and said multiple lenses have returned to ordinary temperature.

* * * * *